US012586765B2

(12) United States Patent
Yu et al.

(10) Patent No.: US 12,586,765 B2
(45) Date of Patent: Mar. 24, 2026

(54) SURFACE MODIFICATION FOR METAL-CONTAINING PHOTORESIST DEPOSITION

(71) Applicant: Lam Research Corporation, Fremont, CA (US)

(72) Inventors: Jengyi Yu, San Ramon, CA (US); Da Li, Newark, CA (US); Younghee Lee, Pleasanton, CA (US); Samantha SiamHwa Tan, Newark, CA (US); Alan J. Jensen, Mountain House, CA (US); Jun Xue, Fremont, CA (US); Mary Anne Manumpil, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 648 days.

(21) Appl. No.: 17/998,354

(22) PCT Filed: May 25, 2021

(86) PCT No.: PCT/US2021/034019
§ 371 (c)(1),
(2) Date: Nov. 9, 2022

(87) PCT Pub. No.: WO2021/262371
PCT Pub. Date: Dec. 30, 2021

(65) Prior Publication Data
US 2023/0230811 A1 Jul. 20, 2023

Related U.S. Application Data

(60) Provisional application No. 62/705,335, filed on Jun. 22, 2020.

(51) Int. Cl.
*H01J 37/32* (2006.01)
*G03F 7/004* (2006.01)
(Continued)

(52) U.S. Cl.
CPC ...... *H01J 37/32449* (2013.01); *G03F 7/0042* (2013.01); *G03F 7/094* (2013.01);
(Continued)

(58) Field of Classification Search
CPC ........... H01J 37/32449; H01J 37/32357; H01J 37/321; H01J 37/32816; H01J 37/32899;
(Continued)

(56) References Cited

U.S. PATENT DOCUMENTS 3,513,010 A 5/1970 Notley et al.
3,529,963 A 9/1970 Marchese et al.
(Continued)

FOREIGN PATENT DOCUMENTS

CN 1495861 A 5/2004
CN 1841201 A 10/2006
(Continued)

OTHER PUBLICATIONS

Cardineau, B. et al., "EUV Resists Based on Tin-oxo Clusters", Advances in Patterning Materials and Processes XXXI, Proceedings of Spie, Apr. 4, 2014, vol. 9051, pp. 335-346.
(Continued)

*Primary Examiner* — Caleen O Sullivan
(74) *Attorney, Agent, or Firm* — Weaver Austin Villeneuve & Sampson LLP

(57) ABSTRACT

Techniques described herein relate to methods, apparatus, and systems for promoting adhesion between a substrate and a metal-containing photoresist. For instance, the method may include receiving the substrate in a reaction chamber, the substrate having a first material exposed on its surface, the first material including a silicon-based material and/or a carbon-based material; generating a plasma from a plasma generation gas source that is substantially free of silicon, where the plasma includes chemical functional groups;

(Continued)

exposing the substrate to the plasma to modify the surface of the substrate by forming bonds between the first material and chemical functional groups from the plasma; and depositing the metal-containing photoresist on the modified surface of the substrate, where the bonds between the first material and the chemical functional groups promote adhesion between the substrate and the metal-containing photoresist.

37 Claims, 11 Drawing Sheets

(51) Int. Cl.
| | |
|---|---|
| G03F 7/09 | (2006.01) |
| G03F 7/11 | (2006.01) |
| G03F 7/16 | (2006.01) |
| H01L 21/027 | (2006.01) |
| H01L 21/033 | (2006.01) |

(52) U.S. Cl.
CPC .............. *G03F 7/11* (2013.01); *G03F 7/167* (2013.01); *H01J 37/32357* (2013.01); *H01L 21/0274* (2013.01); *H01L 21/0332* (2013.01); *H01L 21/0337* (2013.01); *H01J 37/321* (2013.01); *H01J 37/32816* (2013.01); *H01J 37/32899* (2013.01); *H01J 2237/3328* (2013.01)

(58) Field of Classification Search
CPC ..................... H01J 2237/3328; G03F 7/0042; G03F 7/094; G03F 7/11; G03F 7/167; G03F 7/16; H01L 21/0274; H01L 21/0332; H01L 21/0337; H01L 21/67207; H01L 21/68
USPC ................................................... 430/311, 14
See application file for complete search history.

(56) References Cited

U.S. PATENT DOCUMENTS

| | | | |
|---|---|---|---|
| 3,576,755 | A | 4/1971 | Patella et al. |
| 3,720,515 | A | 3/1973 | Stanley |
| 4,241,165 | A | 12/1980 | Hughes et al. |
| 4,314,022 | A | 2/1982 | Fisch |
| 4,328,298 | A | 5/1982 | Nester |
| 4,590,149 | A | 5/1986 | Nakane et al. |
| 4,806,456 | A | 2/1989 | Katoh |
| 4,814,243 | A | 3/1989 | Ziger |
| 4,834,834 | A | 5/1989 | Ehrlich et al. |
| 4,842,989 | A | 6/1989 | Taniguchi et al. |
| 4,845,053 | A | 7/1989 | Zajac |
| 5,077,085 | A | 12/1991 | Schnur et al. |
| 5,322,765 | A | 6/1994 | Clecak et al. |
| 5,534,312 | A | 7/1996 | Hill et al. |
| 5,798,203 | A | 8/1998 | Haraguchi et al. |
| 5,925,494 | A | 7/1999 | Horn |
| 6,017,553 | A | 1/2000 | Burrell et al. |
| 6,162,577 | A | 12/2000 | Felter et al. |
| 6,179,922 | B1 | 1/2001 | Ishikawa et al. |
| 6,183,934 | B1 | 2/2001 | Kawamonzen |
| 6,245,650 | B1 | 6/2001 | Watanabe |
| 6,261,938 | B1 | 7/2001 | Beauvais et al. |
| 6,290,779 | B1 | 9/2001 | Saleh et al. |
| 6,348,239 | B1 | 2/2002 | Hill et al. |
| 6,566,276 | B2 | 5/2003 | Maloney et al. |
| 6,573,030 | B1 | 6/2003 | Fairbairn et al. |
| 6,607,867 | B1 | 8/2003 | Kim et al. |
| 6,797,439 | B1 | 9/2004 | Alpay |
| 6,841,341 | B2 | 1/2005 | Fairbairn et al. |
| 7,223,526 | B2 | 5/2007 | Fairbairn et al. |
| 7,232,742 | B1 | 6/2007 | Maekawa |
| 7,335,462 | B2 | 2/2008 | Fairbairn et al. |

| | | | |
|---|---|---|---|
| 7,608,367 | B1 | 10/2009 | Aigeldinger et al. |
| 8,465,903 | B2 | 6/2013 | Weidman et al. |
| 8,536,068 | B2 | 9/2013 | Weidman et al. |
| 8,664,124 | B2 | 3/2014 | Graff |
| 8,664,513 | B2 | 3/2014 | Pfenninger et al. |
| 8,703,386 | B2 | 4/2014 | Bass et al. |
| 8,883,405 | B2 | 11/2014 | Shiobara |
| 9,023,731 | B2 | 5/2015 | Ji et al. |
| 9,310,684 | B2 | 4/2016 | Meyers et al. |
| 9,551,924 | B2 | 1/2017 | Burkhardt et al. |
| 9,632,411 | B2 | 4/2017 | Michaelson et al. |
| 9,778,561 | B2 | 10/2017 | Marks et al. |
| 9,823,564 | B2 | 11/2017 | Stowers et al. |
| 9,996,004 | B2 | 6/2018 | Smith et al. |
| 10,025,179 | B2 | 7/2018 | Meyers et al. |
| 10,228,618 | B2 | 3/2019 | Meyers et al. |
| 10,416,554 | B2 | 9/2019 | Meyers et al. |
| 10,514,598 | B2 | 12/2019 | Marks et al. |
| 10,580,585 | B2 | 3/2020 | Snaith et al. |
| 10,627,719 | B2 | 4/2020 | Waller et al. |
| 10,642,153 | B2 | 5/2020 | Meyers et al. |
| 10,649,328 | B2 | 5/2020 | Stowers et al. |
| 10,732,505 | B1 | 8/2020 | Meyers et al. |
| 10,775,696 | B2 | 9/2020 | Meyers et al. |
| 10,782,610 | B2 | 9/2020 | Stowers et al. |
| 10,787,466 | B2 | 9/2020 | Edson et al. |
| 10,831,096 | B2 | 11/2020 | Marks et al. |
| 11,209,729 | B2 | 12/2021 | Marks et al. |
| 11,314,168 | B2 | 4/2022 | Tan et al. |
| 11,988,965 | B2 | 5/2024 | Tan et al. |
| 12,105,422 | B2 | 10/2024 | Tan et al. |
| 12,436,464 | B2 | 10/2025 | Weidman et al. |
| 2002/0017243 | A1 | 2/2002 | Pyo |
| 2002/0180372 | A1 | 12/2002 | Yamazaki |
| 2003/0008246 | A1 | 1/2003 | Cheng et al. |
| 2003/0049571 | A1 | 3/2003 | Hallock et al. |
| 2003/0183244 | A1 | 10/2003 | Rossman |
| 2004/0113087 | A1 | 6/2004 | Ikeda et al. |
| 2004/0121264 | A1 | 6/2004 | Liegl et al. |
| 2004/0175631 | A1 | 9/2004 | Crocker et al. |
| 2004/0191423 | A1 | 9/2004 | Ruan et al. |
| 2004/0209201 | A1 | 10/2004 | Nakano et al. |
| 2004/0213563 | A1 | 10/2004 | Irie |
| 2005/0167617 | A1 | 8/2005 | Derra et al. |
| 2005/0208389 | A1 | 9/2005 | Ishibashi et al. |
| 2005/0250052 | A1 | 11/2005 | Nguyen |
| 2005/0253077 | A1 | 11/2005 | Ikeda et al. |
| 2006/0001064 | A1 | 1/2006 | Hill et al. |
| 2006/0068173 | A1 | 3/2006 | Kajiyama et al. |
| 2006/0147818 | A1 | 7/2006 | Lee |
| 2006/0151462 | A1 | 7/2006 | Lee et al. |
| 2006/0166537 | A1 | 7/2006 | Thompson et al. |
| 2006/0175558 | A1 | 8/2006 | Bakker et al. |
| 2007/0017386 | A1 | 1/2007 | Kamei |
| 2007/0037357 | A1 | 2/2007 | Culp |
| 2007/0074541 | A1 | 4/2007 | Badding et al. |
| 2007/0181816 | A1 | 8/2007 | Ikeda et al. |
| 2007/0287073 | A1 | 12/2007 | Goodwin |
| 2008/0004203 | A1 | 1/2008 | Scheuing et al. |
| 2008/0157011 | A1 | 7/2008 | Nagai et al. |
| 2008/0236620 | A1 | 10/2008 | Shih et al. |
| 2009/0041650 | A1 | 2/2009 | Watanabe et al. |
| 2009/0134119 | A1 | 5/2009 | Matsumaru et al. |
| 2009/0197086 | A1* | 8/2009 | Rathi ..................... G03F 7/091 |
| | | | 428/408 |
| 2009/0208880 | A1 | 8/2009 | Nemani et al. |
| 2009/0239155 | A1 | 9/2009 | Levinson et al. |
| 2009/0305174 | A1 | 12/2009 | Shiobara et al. |
| 2009/0325387 | A1 | 12/2009 | Chen et al. |
| 2010/0051446 | A1 | 3/2010 | Wang et al. |
| 2010/0075508 | A1 | 3/2010 | Seino et al. |
| 2010/0131093 | A1 | 5/2010 | Yokoyama et al. |
| 2010/0197135 | A1 | 8/2010 | Ishizaka |
| 2010/0266969 | A1 | 10/2010 | Shiraishi et al. |
| 2010/0304027 | A1 | 12/2010 | Lee et al. |
| 2010/0310790 | A1 | 12/2010 | Chang et al. |
| 2011/0028000 | A1 | 2/2011 | Rogojina et al. |
| 2011/0104595 | A1 | 5/2011 | Hayashi et al. |
| 2011/0174606 | A1 | 7/2011 | Funk et al. |

(56)     References Cited

U.S. PATENT DOCUMENTS

| | | |
|---|---|---|
| 2011/0184139 A1 | 7/2011 | Malik et al. |
| 2011/0195362 A1 | 8/2011 | Watanabe et al. |
| 2011/0198756 A1 | 8/2011 | Thenappan et al. |
| 2011/0209725 A1 | 9/2011 | Kim et al. |
| 2011/0244402 A1 | 10/2011 | Carcasi et al. |
| 2011/0308942 A1 | 12/2011 | Liu et al. |
| 2012/0088193 A1 | 4/2012 | Weidman et al. |
| 2012/0088369 A1 | 4/2012 | Weidman et al. |
| 2012/0090547 A1 | 4/2012 | Wang et al. |
| 2012/0202357 A1 | 8/2012 | Sato et al. |
| 2012/0208125 A1 | 8/2012 | Hatakeyama |
| 2012/0223418 A1 | 9/2012 | Stowers et al. |
| 2012/0322011 A1 | 12/2012 | Wu et al. |
| 2013/0129995 A1 | 5/2013 | Ouattara et al. |
| 2013/0157177 A1 | 6/2013 | Yu et al. |
| 2013/0164691 A1 | 6/2013 | Shiobara |
| 2013/0183609 A1 | 7/2013 | Seon et al. |
| 2013/0224652 A1 | 8/2013 | Bass et al. |
| 2014/0014745 A1 | 1/2014 | Burrows et al. |
| 2014/0170563 A1 | 6/2014 | Hatakeyama |
| 2014/0170853 A1 | 6/2014 | Shamma et al. |
| 2014/0206200 A1 | 7/2014 | Nelson |
| 2014/0209015 A1 | 7/2014 | Yamada et al. |
| 2014/0220495 A1 | 8/2014 | Bozano et al. |
| 2014/0239462 A1 | 8/2014 | Shamma et al. |
| 2014/0263172 A1 | 9/2014 | Xie et al. |
| 2014/0268082 A1 | 9/2014 | Michaelson et al. |
| 2014/0272726 A1 | 9/2014 | Chang |
| 2015/0056542 A1 | 2/2015 | Meyers et al. |
| 2015/0079393 A1 | 3/2015 | Freedman et al. |
| 2015/0125679 A1 | 5/2015 | Ishikawa |
| 2015/0152551 A1 | 6/2015 | Yamaguchi et al. |
| 2015/0221519 A1 | 8/2015 | Marks et al. |
| 2015/0303064 A1 | 10/2015 | Singer et al. |
| 2016/0011505 A1 | 1/2016 | Stowers et al. |
| 2016/0011516 A1 | 1/2016 | Devilliers |
| 2016/0035631 A1 | 2/2016 | Lee et al. |
| 2016/0086864 A1 | 3/2016 | Fischer et al. |
| 2016/0116839 A1 | 4/2016 | Meyers et al. |
| 2016/0216606 A1 | 7/2016 | Meyers et al. |
| 2016/0284559 A1 | 9/2016 | Kikuchi et al. |
| 2016/0357103 A1 | 12/2016 | Nagahara et al. |
| 2016/0357107 A1 | 12/2016 | Buchberger, Jr. et al. |
| 2017/0010535 A1 | 1/2017 | Fujitani et al. |
| 2017/0066225 A1 | 3/2017 | Chen et al. |
| 2017/0092495 A1 | 3/2017 | Chen et al. |
| 2017/0097569 A1 | 4/2017 | Yang et al. |
| 2017/0097570 A1 | 4/2017 | Tagawa |
| 2017/0102612 A1 | 4/2017 | Meyers et al. |
| 2017/0146909 A1 | 5/2017 | Smith et al. |
| 2017/0154766 A1 | 6/2017 | Ogihara et al. |
| 2017/0168398 A1 | 6/2017 | Zi et al. |
| 2017/0176858 A1 | 6/2017 | Hirano |
| 2017/0261850 A1 | 9/2017 | Stowers et al. |
| 2018/0004083 A1 | 1/2018 | Marks et al. |
| 2018/0012759 A1 | 1/2018 | Smith et al. |
| 2018/0039172 A1 | 2/2018 | Stowers et al. |
| 2018/0039182 A1 | 2/2018 | Zi et al. |
| 2018/0046086 A1 | 2/2018 | Waller et al. |
| 2018/0096840 A1 | 4/2018 | Jeong et al. |
| 2018/0122648 A1 | 5/2018 | Kim et al. |
| 2018/0149976 A1 | 5/2018 | Liu et al. |
| 2018/0164689 A1 | 6/2018 | Sano et al. |
| 2018/0166278 A1 | 6/2018 | Belyansky et al. |
| 2018/0173096 A1 | 6/2018 | Zi et al. |
| 2018/0224744 A1 | 8/2018 | Bae et al. |
| 2018/0233362 A1* | 8/2018 | Glodde ............... G03F 7/70016 |
| 2018/0307137 A1 | 10/2018 | Meyers et al. |
| 2018/0308687 A1 | 10/2018 | Smith et al. |
| 2018/0314167 A1 | 11/2018 | Chang et al. |
| 2018/0354804 A1 | 12/2018 | Venkatasubramanian et al. |
| 2018/0356731 A1 | 12/2018 | Tagawa |
| 2019/0056914 A1 | 2/2019 | Ma et al. |
| 2019/0094685 A1 | 3/2019 | Marks et al. |
| 2019/0129307 A1 | 5/2019 | Kwon et al. |
| 2019/0137870 A1 | 5/2019 | Meyers et al. |
| 2019/0146337 A1 | 5/2019 | Zi et al. |
| 2019/0153001 A1 | 5/2019 | Cardineau et al. |
| 2019/0163056 A1 | 5/2019 | Maes et al. |
| 2019/0163065 A1 | 5/2019 | Hatakeyama et al. |
| 2019/0172714 A1 | 6/2019 | Bobek et al. |
| 2019/0187556 A1* | 6/2019 | Park ................... H01L 21/0276 |
| 2019/0244809 A1 | 8/2019 | Ono |
| 2019/0258160 A1 | 8/2019 | Satoh et al. |
| 2019/0259601 A1 | 8/2019 | De Silva et al. |
| 2019/0308998 A1 | 10/2019 | Cardineau et al. |
| 2019/0315781 A1 | 10/2019 | Edson et al. |
| 2019/0315782 A1 | 10/2019 | Edson et al. |
| 2019/0333777 A1 | 10/2019 | Hsieh et al. |
| 2019/0348292 A1 | 11/2019 | Dutta et al. |
| 2019/0352776 A1 | 11/2019 | Parikh |
| 2019/0369489 A1 | 12/2019 | Meyers et al. |
| 2019/0391486 A1 | 12/2019 | Jiang et al. |
| 2020/0041901 A1 | 2/2020 | Namgung et al. |
| 2020/0050109 A1 | 2/2020 | Ho et al. |
| 2020/0064733 A1 | 2/2020 | Meyers et al. |
| 2020/0066536 A1 | 2/2020 | Yaegashi |
| 2020/0089104 A1 | 3/2020 | Marks et al. |
| 2020/0096870 A1 | 3/2020 | Ma et al. |
| 2020/0124970 A1 | 4/2020 | Kocsis et al. |
| 2020/0174374 A1 | 6/2020 | Liao et al. |
| 2020/0209756 A1 | 7/2020 | Waller et al. |
| 2020/0239498 A1 | 7/2020 | Clark et al. |
| 2020/0241413 A1 | 7/2020 | Clark et al. |
| 2020/0257196 A1 | 8/2020 | Meyers et al. |
| 2020/0292937 A1 | 9/2020 | Stowers et al. |
| 2020/0326627 A1 | 10/2020 | Jiang et al. |
| 2020/0393765 A1 | 12/2020 | Sakanishi |
| 2021/0013034 A1 | 1/2021 | Wu et al. |
| 2021/0013037 A1 | 1/2021 | Sun et al. |
| 2021/0041784 A1 | 2/2021 | Chen et al. |
| 2021/0111025 A1 | 4/2021 | Zyulkov et al. |
| 2021/0216016 A1 | 7/2021 | Tagawa |
| 2021/0271170 A1 | 9/2021 | Telecky et al. |
| 2021/0302833 A1 | 9/2021 | Weng et al. |
| 2021/0349390 A1 | 11/2021 | De Schepper et al. |
| 2021/0397085 A1 | 12/2021 | Weidman et al. |
| 2022/0020584 A1 | 1/2022 | Volosskiy et al. |
| 2022/0035247 A1 | 2/2022 | Tan et al. |
| 2022/0037152 A1 | 2/2022 | Raley et al. |
| 2022/0043334 A1 | 2/2022 | Tan et al. |
| 2022/0075260 A1 | 3/2022 | Marks et al. |
| 2022/0244645 A1 | 8/2022 | Tan et al. |
| 2022/0299877 A1 | 9/2022 | Weidman et al. |
| 2022/0308454 A1 | 9/2022 | Weidman et al. |
| 2022/0308462 A1 | 9/2022 | Berney et al. |
| 2022/0342301 A1 | 10/2022 | Weidman et al. |
| 2022/0344136 A1 | 10/2022 | Peter et al. |
| 2022/0365434 A1 | 11/2022 | Nardi et al. |
| 2023/0031955 A1 | 2/2023 | Yu et al. |
| 2023/0152705 A1 | 5/2023 | Grzeskowiak et al. |
| 2023/0185196 A1 | 6/2023 | Weidman et al. |
| 2023/0266670 A1 | 8/2023 | Hansen et al. |
| 2023/0341781 A1 | 10/2023 | Han et al. |
| 2024/0036474 A1 | 2/2024 | Peter et al. |
| 2024/0192590 A1 | 6/2024 | Kanakasabapathy et al. |
| 2024/0329539 A1 | 10/2024 | Tan et al. |
| 2025/0053084 A1 | 2/2025 | Hansen et al. |
| 2025/0093781 A1 | 3/2025 | Peter et al. |
| 2025/0244678 A1 | 7/2025 | Lee et al. |
| 2025/0271766 A1 | 8/2025 | Hansen et al. |

FOREIGN PATENT DOCUMENTS

| | | |
|---|---|---|
| CN | 101828266 A | 9/2010 |
| CN | 102610516 A | 7/2012 |
| CN | 104637792 A | 5/2015 |
| CN | 105489635 A | 4/2016 |
| CN | 105579906 A | 5/2016 |
| CN | 106876251 A | 6/2017 |
| CN | 107153326 A | 9/2017 |
| CN | 108351594 A | 7/2018 |
| CN | 108388079 A | 8/2018 |
| CN | 109521657 A | 3/2019 |

(56) References Cited

FOREIGN PATENT DOCUMENTS

| | | | |
|---|---|---|---|
| CN | 109976097 | A | 7/2019 |
| CN | 110609441 | A | 12/2019 |
| CN | 116009357 | A | 4/2023 |
| EP | 1253629 | A2 | 10/2002 |
| EP | 1123423 | B1 | 8/2007 |
| EP | 3230294 | A1 | 10/2017 |
| EP | 3596155 | B1 | 8/2022 |
| JP | S52144972 | A | 12/1977 |
| JP | S5883847 | A | 5/1983 |
| JP | H03228327 | A | 10/1991 |
| JP | H0572747 | A | 3/1993 |
| JP | H0745580 | A | 2/1995 |
| JP | H0757995 | A | 3/1995 |
| JP | H07106224 | A | 4/1995 |
| JP | H07244386 | A | 9/1995 |
| JP | H0831781 | A | 2/1996 |
| JP | H08330288 | A | 12/1996 |
| JP | H08339950 | A | 12/1996 |
| JP | H10172957 | A | 6/1998 |
| JP | H10301298 | A | 11/1998 |
| JP | 2000223461 | A | 8/2000 |
| JP | 2001250813 | A | 9/2001 |
| JP | 2003213001 | A | 7/2003 |
| JP | 2003532303 | A | 10/2003 |
| JP | 2004006798 | A | 1/2004 |
| JP | 2005504146 | A | 2/2005 |
| JP | 2005123651 | A | 5/2005 |
| JP | 2005317652 | A | 11/2005 |
| JP | 2006253282 | A | 9/2006 |
| JP | 2009192350 | A | 8/2009 |
| JP | 2010074065 | A | 4/2010 |
| JP | 2010531931 | A | 9/2010 |
| JP | 2010239087 | A | 10/2010 |
| JP | 2010245327 | A | 10/2010 |
| JP | 2011511476 | A | 4/2011 |
| JP | 2011099956 | A | 5/2011 |
| JP | 2011520242 | A | 7/2011 |
| JP | 2011529126 | A | 12/2011 |
| JP | 2012173315 | A | 9/2012 |
| JP | 2012185485 | A | 9/2012 |
| JP | 5055743 | B2 | 10/2012 |
| JP | 2013096011 | A | 5/2013 |
| JP | 2013135066 | A | 7/2013 |
| JP | 2013542944 | A | 11/2013 |
| JP | 2014521111 | A | 8/2014 |
| JP | 5705103 | B2 | 4/2015 |
| JP | 2015513540 | A | 5/2015 |
| JP | 2015201622 | A | 11/2015 |
| JP | 2016530565 | A | 9/2016 |
| JP | 2017108053 | A | 6/2017 |
| JP | 2017116923 | A | 6/2017 |
| JP | 2017532407 | A | 11/2017 |
| JP | 2018502173 | A | 1/2018 |
| JP | 2018098229 | A | 6/2018 |
| JP | 2018518688 | A | 7/2018 |
| JP | 2019500490 | A | 1/2019 |
| JP | 2019506730 | A | 3/2019 |
| JP | 2019095794 | A | 6/2019 |
| JP | 2019135755 | A | 8/2019 |
| JP | 2019532182 | A | 11/2019 |
| JP | 2020129607 | A | 8/2020 |
| JP | 2021005737 | A | 1/2021 |
| JP | 2022502714 | A | 1/2022 |
| KR | 100398312 | B1 | 9/2003 |
| KR | 20090042059 | A | 4/2009 |
| KR | 20120093781 | A | 8/2012 |
| KR | 20130093038 | A | 8/2013 |
| KR | 20140106442 | A | 9/2014 |
| KR | 20150129781 | A | 11/2015 |
| KR | 20160082969 | A | 7/2016 |
| KR | 20190060678 | A | 6/2019 |
| KR | 20200144580 | A | 12/2020 |
| TW | 200947117 | A | 11/2009 |
| TW | 201140230 | A | 11/2011 |
| TW | 201224190 | A | 6/2012 |
| TW | I365354 | B | 6/2012 |
| TW | 201241555 | A | 10/2012 |
| TW | 201327057 | A | 7/2013 |
| TW | 201502696 | A | 1/2015 |
| TW | I494689 | B | 8/2015 |
| TW | 201539539 | A | 10/2015 |
| TW | 201631377 | A | 9/2016 |
| TW | 201729006 | A | 8/2017 |
| TW | 201734667 | A | 10/2017 |
| TW | 201826034 | A | 7/2018 |
| TW | 201903886 | A | 1/2019 |
| TW | 201907445 | A | 2/2019 |
| TW | 201931011 | A | 8/2019 |
| TW | 201937545 | A | 9/2019 |
| TW | 202001993 | A | 1/2020 |
| TW | 202006168 | A | 2/2020 |
| TW | 202117468 | A | 5/2021 |
| WO | WO-03029015 | A2 | 4/2003 |
| WO | WO-2004095551 | A1 | 11/2004 |
| WO | WO-2007123539 | A1 | 11/2007 |
| WO | WO-2008139621 | A1 | 11/2008 |
| WO | WO-2011081151 | A1 | 7/2011 |
| WO | WO-2012048094 | A3 | 7/2012 |
| WO | WO-2013119134 | A1 | 8/2013 |
| WO | WO-2013128313 | A1 | 9/2013 |
| WO | WO-2014152023 | A1 | 9/2014 |
| WO | WO-2016065120 | A1 | 4/2016 |
| WO | WO-2016144960 | A1 | 9/2016 |
| WO | WO-2017002497 | A1 | 1/2017 |
| WO | WO-2017066319 | A2 | 4/2017 |
| WO | WO-2017198418 | A1 | 11/2017 |
| WO | WO-2018004551 | A1 | 1/2018 |
| WO | WO-2018061670 | A1 | 4/2018 |
| WO | WO-2019059074 | A1 | 3/2019 |
| WO | WO-2019125952 | A1 | 6/2019 |
| WO | WO-2019163455 | A1 | 8/2019 |
| WO | WO-2019217749 | A1 | 11/2019 |
| WO | WO-2019241402 | A1 | 12/2019 |
| WO | WO-2020102085 | A1 | 5/2020 |
| WO | WO-2020132281 | A1 | 6/2020 |
| WO | WO-2020190941 | A1 | 9/2020 |
| WO | WO-2020263750 | A1 | 12/2020 |
| WO | WO-2020264158 | A1 | 12/2020 |
| WO | WO-2020264556 | A1 | 12/2020 |
| WO | WO-2020264571 | A1 | 12/2020 |
| WO | WO-2021072042 | A1 | 4/2021 |
| WO | WO-2021202681 | A1 | 10/2021 |
| WO | WO-2021262529 | A1 | 12/2021 |
| WO | WO-2022006349 | A1 | 1/2022 |
| WO | WO-2022016128 | A1 | 1/2022 |

OTHER PUBLICATIONS

Chinese First Office Action dated May 24, 2017 issued in Application No. CN 201510053668.7.
Chinese Second Office Action dated Feb. 28, 2018 issued in Application No. CN 201510053668.7.
CN Office Action dated Jun. 8, 2022 in Application No. CN202180002531.2 With English Translation.
CN Office Action dated Nov. 16, 2022, in Application No. CN202180002531.2 with English translation.
CN Office Action dated Nov. 18, 2022, in Application No. CN201810783756.6 with English translation.
Coons et al., (2010) "Comparison of EUV spectral and ion emission features from laser-produced Sn and Li plasmas," Extreme Ultraviolet (EUV) Lithography, Proc. of SPIE, 7636:763636-1 to 763636-7.
European Search Report dated Feb. 15, 2022, in Application No. EP21741104.
European Office Action dated Feb. 25, 2022 in U.S. Appl. No. 21/741,104.
Extended European Search Report dated Dec. 23, 2021, in Application No. EP19800353.5.
Gerritsen et al., (Apr. 1, 1986) "Laser-generated plasma as soft x-ray source," J. Appl. Phys., 59(7):2337-2344.
Hamley, I.W., "Nanostructure fabrication using block copolymers", Nanotechnology. Sep. 2003. 17;14(10):R39-R54.

(56) References Cited

OTHER PUBLICATIONS

Hench, L.L. and West, J.K., "The sol-gel process," Chemical reviews, Jan. 1, 1990; 90(1) pp. 33-72.

International Preliminary Report on Patentability dated Oct. 13, 2022, in PCT Application No. PCT/US2021/023493.

International Search Report and Written Opinion dated Aug. 4, 2021, in PCT Application No. PCT/US2021/023493.

International Search Report and Written Opinion dated Mar. 4, 2022, in Application No. PCT/US2021/058647.

International Search Report and Written Opinion dated Oct. 8, 2020 in Application No. WO2020US38968.

International Preliminary Report on Patentability dated Jul. 1, 2021 issued in Application No. PCT/US2019/067540.

International Preliminary Report on Patentability dated May 27, 2021 issued in Application No. PCT/US2019/060742.

International Search Report and Written Opinion dated May 17, 2021 issued in Application No. PCT/US2021/015656.

International Preliminary Report on Patentability dated Apr. 14, 2022 issued in Application No. PCT/US2020/053856.

International Preliminary Report on Patentability dated Aug. 18, 2022 in PCT Application No. PCT/US2021/015656.

International Preliminary Report on Patentability dated Jan. 27, 2021 in Application PCT/US2020/054730.

International Preliminary Report on Patentability dated Jan. 6, 2022 in PCT Application No. PCT/US2020/038968.

International Preliminary Report on Patentability dated Jan. 6, 2022 in PCT Application No. PCT/US2020/039615.

International Preliminary Report on Patentability dated Jan. 6, 2022 in PCT Application No. PCT/US2020/070171.

International Preliminary Report on Patentability dated Jan. 6, 2022 in PCT Application No. PCT/US2020/070172.

International Preliminary Report on Patentability dated Jan. 6, 2022 in PCT Application No. PCT/US2020/070187.

International Preliminary Report on Patentability dated Jul. 28, 2022 in PCT Application No. PCT/US2021/012953.

International Search Report and Written Opinion dated May 12, 2021 issued in Application No. PCT/US2021/012953.

International Search Report and Written Opinion dated Apr. 10, 2020 issued in Application No. PCT/US2019/060742.

International Search Report and Written Opinion dated Apr. 24, 2020 issued in Application No. PCT/US2019/067540.

International Search Report and Written Opinion dated Aug. 22, 2019 issued in Application No. PCT/US2019/031618.

International Search Report and Written Opinion dated Jan. 27, 2021 issued in Application No. PCT/US2020/054730.

International Search Report and Written Opinion dated Mar. 23, 2021 issued in Application No. PCT/US2020/053856.

International Search Report and Written Opinion dated Oct. 16, 2020 issued in Application No. PCT/US2020/039615.

International Search Report and Written Opinion dated Oct. 16, 2020 issued in Application No. PCT/US2020/070171.

International Search Report and Written Opinion dated Oct. 16, 2020 issued in Application No. PCT/US2020/070172.

International Search Report and Written Opinion dated Oct. 16, 2020 issued in Application No. PCT/US2020/070187.

International Search Report and Written Opinion dated Oct. 28, 2021 in PCT Application No. PCT/US2021/040381.

International Search Report and Written Opinion dated Oct. 8, 2020 issued in Application No. PCT/US2020/038968.

Japanese Decision to Grant dated Feb. 12, 2019 issued in Application No. JP 2015-016254.

Japanese Decision to Grant dated May 3, 2021 issued in Application No. JP 2016-220096.

Japanese First Office Action dated Oct. 30, 2018 issued in Application No. JP 2015-016254.

Japanese First Office Action dated Sep. 15, 2020 issued in Application No. JP 2016- 220096.

JP Office Action dated Jul. 26, 2022 in Application No. JP2021102822 With English translation.

JP Office Action dated Jun. 28, 2022 in Application No. JP2021560945.

JP Office Action dated Nov. 15, 2022, in Application No. JP2021-176082 with English translation.

Korean Decision for Grant dated Sep. 2, 2021 issued in Application No. KR 10-2015-0015184.

Korean First Office Action dated Dec. 22, 2020 issued in Application No. KR 10-2015-0015184.

Korean Second Office Action dated Jul. 27, 2021 issued in Application No. KR 10-2015-0015184.

KR Office Action dated Feb. 8, 2022, in Application No. KR10-2021-7030794 with English Translation.

KR Office Action dated May 9, 2022, in Application No. KR1020217030794 with English translation.

Kwon, J., et al., "Substrate Selectivity of (tBu-Allyl)Co(C0)3 during Thermal Atomic Layer Deposition of Cobalt," Chemistry of Materials, Mar. 27, 2012; 24(6): pp. 1025-1030.

Lemaire, P.C., et al., "Understanding inherent substrate selectivity during atomic layer deposition: Effect of surface preparation, hydroxyl density, and metal oxide composition on nucleation mechanisms during tungsten ALD" The Journal of chemical physics, Feb. 7, 2017, 146(5):052811.

Lu, Y., et al., "Continuous formation of supported cubic and hexagonal mesoporous films by sol-gel dip-coating" Nature, Sep. 1997, 389(6649), pp. 364-368.

Mackus, A.J., et al. "The use of atomic layer deposition in advanced nanopatterning", Nanoscale. Jul. 25, 2014; 6(19):10941-60.

McGinniss, Vincent D., (1978) "Light Sources," Edited by: Pappas, S. Peter, UV Curing: Science and Technology; technology marketing corporation, 642 Westover Rd., Stamford, CT, USA; pp. 96-129.

Nazarov, D.V., et al., "Atomic layer deposition of tin dioxide nanofilms: A review", Rev. Adv. Mater. Sci. Jun. 1, 2015; 40(3):262-75.

Notice of Allowance dated Dec. 9, 2021 in U.S. Appl. No. 17/310,635.

Rantala, et al., "New resist and underlayer approaches toward EUV lithography," Proc. SPIE 10809, International Conference on Extreme Ultraviolet Lithography 2018, pp. 108090X-1-108090X-8. (Oct. 11, 2018).

Spitzer et al., (Mar. 1, 1986) "Conversion efficiencies from laser-produced plasmas in the extreme ultraviolet regime," J. Appl. Phys., 79(5):2251-2258.

Stowers et al.; "Directly patterned inorganic hard mask for EUV lithography"; proceedings of the SPIE 7969; Extreme Ultraviolet (EUV) Lithography 11, 796915-1-11 (Apr. 7, 2011), event: SPI E Advanced Lithography, 2011, San Jose California.

Taiwanese First Office Action dated Aug. 10, 2020 issued in Application No. TW 105137362.

Taiwanese First Office Action dated May 31, 2018 issued in Application No. TW 104103153.

Taiwanese Second Office Action dated Nov. 18, 2020 issued in Application No. TW 105137362.

TW Office Action dated Sep. 5, 2022, in Application No. TW110101388 with English translation.

TW Office Action dated Apr. 29, 2022 in Application No. TW110118172 with English translation.

TW Office Action dated Jun. 3, 2022, in Application No. TW110143913.

TW Office Action dated Mar. 7, 2022, in Application No. TW110101388 with English translation.

US Final Office Action, dated May 11, 2017, issued in U.S. Appl. No. 14/610,038.

US Final Office Action, dated Sep. 10, 2018, issued in U.S. Appl. No. 15/691,659.

US Notice of Allowance, dated Apr. 25, 2018 issued in U.S. Appl. No. 14/948,109.

US Notice of Allowance, dated Aug. 22, 2017, issued in U.S. Appl. No. 14/610,038.

U.S. Notice of Allowance dated Feb. 22, 2022 in U.S. Appl. No. 17/310,635.

US Notice of Allowance, dated Jul. 28, 2020, issued in U.S. Appl. No. 16/206,959.

US Notice of Allowance dated Sep. 15, 2021, issued in U.S. Appl. No. 16/691,508.

US Notice of Allowance, dated Sep. 19, 2019, issued in U.S. Appl. No. 15/691,659.

(56)           References Cited

OTHER PUBLICATIONS

US Notice of Allowance dated Sep. 9, 2021, issued in U.S. Appl. No. 16/691,508.
US Office Action, dated Apr. 9, 2019, issued in U.S. Appl. No. 15/691,659.
US Office Action, dated Jan. 23, 2017, issued in U.S. Appl. No. 14/610,038.
US Office Action, dated Mar. 5, 2020, issued in U.S. Appl. No. 16/206,959.
US Office Action dated May 14, 2021, issued in U.S. Appl. No. 16/691,508.
US Office Action, dated May 21, 2018, issued in U.S. Appl. No. 15/691,659.
US Office Action, dated Nov. 2, 2017, issued in U.S. Appl. No. 14/948,109.
U.S. Appl. No. 17/758,125, Inventors Yu et al., filed Jun. 28, 2022.
U.S. Appl. No. 17/758,567, Inventors Yu et al., filed Jul. 8, 2022.
U.S. Appl. No. 17/759,281, inventors Dictus et al., filed Jul. 21, 2022.
U.S. Appl. No. 17/905,632, inventor Kanakasabapathy., filed Sep. 2, 2022.
U.S. Appl. No. 17/905,754, inventors Kanakasabapathy et al., filed Sep. 6, 2022.
U.S. Restriction Requirement dated Nov. 14, 2022 in U.S. Appl. No. 17/455,185.
Xu, et al., "Underlayer designs to enhance the performance of EUV resists," Proceedings of SPIE, vol. 7273, 2009, pp. 727311-1-727311-11.
Barret M C., et al., "Copper, Zinc and Tin Hydroxypyridinones," Transition Metal Chemistry, Jan. 2015, vol. 40, pp. 241-254.
Cilibrizzi A., et al., "Hydroxypyridinone Journey into Metal Chelation," Chemical Review, Jul. 2018, vol. 118, pp. 7657-7701.
CN Office Action dated Jan. 22, 2024 in CN Application No. 202080047683.X, with English Translation.
CN Office Action dated Jul. 26, 2024 in CN Application No. 202080047683.X with English translation.
EP Extended European Search report dated Apr. 15, 2025 in EP Application No. 22782195.6.
EP Extended European Search Report dated Jun. 26, 2023, in Application No. 20831343.7.
Fitzgerald A., et al., "Determination of Trace Metals in Positive Photoresist," Journal of the Electrochemical Society, May 1992, vol. 139 (5), pp. 1413-1414.
International Search Report and Written Opinion dated Jul. 13, 2021, in PCT Application No. PCT/US2021/023901.
International Preliminary Report on Patentability and Written Opinion dated Feb. 8, 2024 in PCT Application No. PCT/US2022/037393.
International Preliminary Report on Patentability and Written Opinion dated Feb. 8, 2024 in PCT Application No. PCT/US2022/037733.
International Preliminary Report on Patentability and Written Opinion dated Jun. 27, 2024 in PCT Application No. PCT/US2022/081376.
International Preliminary Report on Patentability and Written Opinion dated Nov. 14, 2024 in PCT Application No. PCT/US2023/019871.
International Preliminary Report on Patentability dated Jan. 26, 2023 in PCT Application No. PCT/US2021/042106.
International Preliminary Report on Patentability dated Oct. 12, 2023, in PCT Application No. PCT/US2022/022790.
International Preliminary Report on Patentability dated Oct. 13, 2022, in PCT Application No. PCT/US2021/023901.
International Search Report and Written Opinion dated Apr. 17, 2023 in PCT Application No. PCT/US2022/081376.
International Search Report and Written Opinion dated Aug. 17, 2023, in Application No. PCT/US2023/019871.
International Search Report and Written Opinion dated Aug. 28, 2024 in PCT Application No. PCT/US2024/028046.

International Search Report and Written Opinion dated Feb. 20, 2025 in PCT Application No. PCT/US2024/054806.
International Search Report and Written Opinion dated Jul. 22, 2022 in Application No. PCT/US2022/022790.
International Search Report and Written Opinion dated Nov. 4, 2021 in PCT Application No. PCT/US2021/042106.
International Search Report and Written Opinion dated Nov. 7, 2022 in PCT Application No. PCT/US2022/037393.
JP Office Action dated Apr. 30, 2025 in JP Application No. 2022547251, with English Translation.
JP Office Action dated Aug. 6, 2024 in JP Application No. 2023-558732, with English Translation.
JP Office Action dated Aug. 19, 2025 in JP Application No. 2022-557680, with English Translation.
JP Office Action dated Dec. 3, 2024 in JP Application No. 2023-558732 with English translation.
JP Office Action dated Dec. 26, 2023 in JP Application No. 20210576241, with English Translation.
JP Office Action dated Feb. 18, 2025 in JP Application No. 2022-557680, with English Translation.
JP Office Action dated Jun. 24, 2025 in JP Application No. 2022577244, with English Translation.
JP Office Action dated Mar. 4, 2025 in JP Application No. 2022-577244, with English Translation.
JP Office Action dated Mar. 26, 2024 in JP Application No. 2023-558732 with English translation.
JP Office Action dated May 13, 2025 in JP Application No. 2023-502906, with English Translation.
JP Office Action dated May 14, 2024 in JP Application No. 2021-576241 with English translation.
JP Office Action dated Oct. 7, 2025 in JP Application No. 2024-197800, with English Translation.
JP Office Action dated Oct. 22, 2024 in JP Application No. 2022-547251 with English translation.
JP Office Action dated Sep. 9, 2025 in JP Application No. 2023-502906, with English Translation.
KR Notice of Allowances dated Jul. 8, 2024, in KR Application No. 10-2024-7006338 with English Translation.
KR Office Action dated Apr. 14, 2025 in KR Application No. 10-2022-7030615, with English Translation.
KR Office Action dated Aug. 27, 2025 in KR Application No. 10-2022-7014896, with English Translation.
KR Office Action dated Jun. 12, 2025 in KR Application No. 10-2023-7001454, with English Translation.
KR Office Action dated Mar. 13, 2025 in KR Application No. 10-2023-7004801, with English Translation.
KR Office Action dated Mar. 19, 2025 in KR Application No. 10-2022-7038020, with English Translation.
KR Office Action dated Mar. 27, 2025 in KR Application No. 10-2022-7003371, with English Translation.
KR Office Action dated May 29, 2025 in KR Application No. 10-2022-7038499, with English Translation.
KR Office Action dated Nov. 28, 2024 in KR Application No. 10-2022-7014896, with English Translation.
SG Search Report and Written Opinion dated Jul. 3, 2024 in SG Application No. 11202114196U.
SG Search Report and Written Opinion dated May 14, 2024 in SG Application No. 11202251864Y.
SG Written Opinion dated Jul. 31, 2024 in SG Application No. 11202307119P.
TW Office Action and Search Report dated Aug. 4, 2025 in TW Application No. 114105681, with English Translation.
TW Office Action and Search Report dated Aug. 15, 2025 in TW Application No. 114123201, with English Translation.
TW Office Action and Search Report dated Dec. 25, 2024 in TW Application No. 111112111, with English Translation.
TW Office Action and Search Report dated Oct. 30, 2025 in TW Application No. 111127705, with English Translation.
TW Office Action dated Apr. 17, 2024 in TW Application No. 111112111 with English translation.
TW Office Action dated Aug. 6, 2024 in TW Application No. 110122525, with English Translation.

(56)                  References Cited

OTHER PUBLICATIONS

TW Office Action dated Aug. 8, 2024 in TW Application No. 111112111, with English Translation.
TW Office Action dated Jul. 2, 2024 in TW Application No. 109134940 with English translation.
TW Office Action dated Jul. 23, 2024 in TW Application No. 110011878, with English Translation.
TW Office Action dated Jun. 27, 2024 in TW Application No. 110103944, with English Translation.
TW Office Action dated Mar. 11, 2024 in TW Application No. 109121649, with English Translation.
TW Office Action dated Mar. 11, 2025 in TW Application No. 110126445, with EnglishTranslation.
TW Office Action dated Nov. 7, 2024 in TW Application No. 111112111, with English Translation.
TW Office Action dated Nov. 26, 2024 in TW Application No. 110126445, with English Translation.
TW Office Action dated Oct. 4, 2024 in TW Application No. 109121649 with English translation.
TW Office Action dated Sep. 25, 2024 in TW Application No. 110111136 with English translation.
U.S. Advisory Action dated Jun. 27, 2025 in U.S. Appl. No. 17/596,858.
U.S. Final Office Action dated Apr. 21, 2025 in U.S. Appl. No. 17/596,858.
U.S. Final Office Action dated Aug. 11, 2025 in U.S. Appl. No. 18/550,733.
U.S. Final Office Action dated Sep. 16, 2024 in U.S. Appl. No. 18/550,733.
US Non-Final Office Action dated Apr. 23, 2025 in U.S. Appl. No. 18/550,733.
U.S. Non-Final Office Action dated Aug. 26, 2025 in U.S. Appl. No. 17/596,858.
US Non-Final Office Action dated Jul. 14, 2025 in U.S. Appl. No. 18/005,571.
US Non-Final Office Action dated Jul. 16, 2025 in U.S. Appl. No. 17/905,754.
US Non-Final Office Action dated Jun. 5, 2025 in U.S. Appl. No. 17/758,567.
US Non-Final Office Action dated Jun. 18, 2025 in U.S. Appl. No. 17/753,110.
U.S. Non-Final Office Action dated May 31, 2024 in U.S. Appl. No. 18/550,733.
U.S. Non-Final Office Action dated Nov. 21, 2024 in U.S. Appl. No. 17/596,858.
U.S. Non-Final Office Action dated Sep. 17, 2024 in U.S. Appl. No. 17/995,355.
U.S. Notice of Allowance dated Apr. 9, 2025 in U.S. Appl. No. 17/995,355.
U.S. Restriction Requirement dated Apr. 3, 2025 in U.S. Appl. No. 17/758,567.
U.S. Restriction requirement dated Feb. 14, 2024, in U.S. Appl. No. 18/550,733.
U.S. Restriction Requirement dated Mar. 20, 2025 in U.S. Appl. No. 17/753,110.
U.S. Restriction Requirement dated Mar. 26, 2025 in U.S. Appl. No. 17/905,754.
Waard H D., et al., "Observations on Implanted Xenon-133 Sources," Proceedings of the Royal Society of London. Series A, Mathematical and Physical Sciences, Jun. 1969, vol. 311 (1504), pp. 139-150.

* cited by examiner

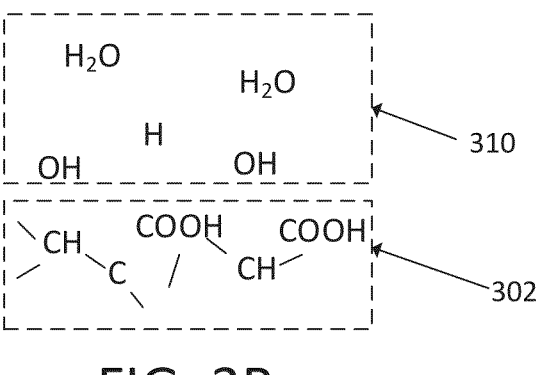
FIG. 3A
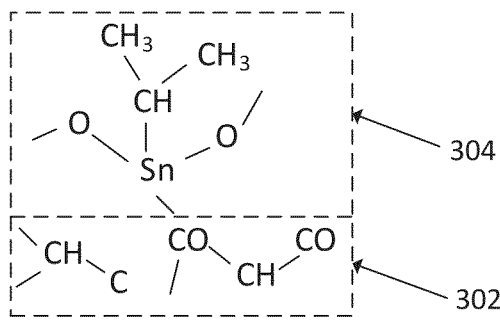
FIG. 3B
FIG. 3C

SURFACE MODIFICATION FOR METAL-CONTAINING PHOTORESIST DEPOSITION

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

As semiconductor fabrication continues to advance, feature sizes continue to shrink and new processing methods are needed. One area where advances are being made is in the context of patterning, for example using metal-containing photoresist materials, including but not limited to those that are sensitive to EUV radiation.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Various embodiments herein relate to methods, apparatus, and systems for processing a semiconductor substrate. Such methods, apparatus, and systems may promote adhesion between a substrate and a metal-containing photoresist.

In one aspect of the disclosed embodiments, a method of promoting adhesion between a substrate and a metal-containing photoresist is provided, the method including: (a) providing the substrate having a surface including a first material, the first material including a silicon-based material and/or a carbon-based material; (b) generating a plasma from a plasma generation gas source, where the plasma generation gas source is substantially free of silicon, and where the plasma includes chemical functional groups; (c) exposing the substrate to the plasma to modify the surface of the substrate by forming bonds between the first material and chemical functional groups from the plasma; and (d) after (c), depositing the metal-containing photoresist on the modified surface of the substrate, where the bonds between the first material and the chemical functional groups from the plasma promote adhesion between the substrate and the metal-containing photoresist.

In various embodiments, one or more particular plasma generation gas source may be used. In many cases, the plasma generation gas source may include at least one species that is organic. For instance, in some embodiments the plasma generation gas source may include carbon dioxide. In these or other embodiments, the plasma generation gas source may include carbon monoxide. In these or other embodiments, the plasma generation gas source may include water vapor. In these or other embodiments, the plasma generation gas source may include an alcohol vapor. In these or other embodiments, the plasma generation gas source may include a halogen gas. In these or other embodiments, the plasma generation gas source may include diatomic oxygen ($O_2$) and/or ozone ($O_3$). In these or other embodiments, the plasma generation gas source may include hydrogen peroxide ($H_2O_2$). In these or other embodiments, the plasma may include one or more chemical functional groups selected from the group consisting of: O radicals, OH radicals, CO radicals, Cl radicals, Br radicals, I radicals, and combinations thereof.

In various embodiments, the plasma generation gas source is substantially free of reactive nitrogen. In these or other embodiments, the plasma generation gas source may further include inert gas and/or hydrogen ($H_2$).

Various different plasma configurations may be used. In some cases, the plasma may be generated remotely and delivered to a reaction chamber where the substrate is exposed to the plasma. In other cases, the plasma may be generated in-situ in a reaction chamber where the substrate is exposed to the plasma.

The first material on the substrate may have a particular composition. For instance, in some cases the first material may include amorphous carbon, spin-on-carbon, spin-on-glass, silicon carbide, or silicon oxycarbide, in some cases the first material includes amorphous silicon, silicon oxide, silicon nitride, or silicon oxynitride.

The methods herein may be used to promote formation of particular bonding structures. In various embodiments, the bonds between the first material and the chemical functional groups from the plasma promote adhesion between the substrate and the metal-containing photoresist by promoting formation of metal-oxygen bonds on the surface of the substrate while depositing the metal-containing photoresist in (d). In certain implementations, exposing the substrate to the plasma may form C—O bonds, C—OH bonds, C—Cl bonds, C—Br bonds, C—I bonds, Si—O bonds, Si—OH bonds, Si—Cl bonds, Si—Br bonds, Si—I bonds, or a combination thereof. In various implementations, depositing the metal-containing photoresist on the modified surface of the substrate forms C—O-metal bonds and/or Si—O-metal bonds.

The methods described herein may be practiced using one or more reaction chamber. The one or more reaction chamber may also be used for deposition, etching, substrate treatment, etc. For instance, in some cases (c) may occur after the first material is deposited on the substrate, in a reaction chamber where the first material is deposited on the substrate. In these or other embodiments, (c) and (d) may occur in the same reaction chamber.

In some embodiments, the method may further include exposing the substrate to a second plasma including inert gas prior to (d), where exposing the substrate to the second plasma increases a surface area of the substrate. Such increased surface area can further promote adhesion between the first material and the metal-containing photoresist.

In some implementations, the first material may be a hardmask material. In some implementations, the first material may be a porous interface layer. In various implementations, the plasma generation gas source may include carbon dioxide, and the method may further include waiting at least about 3 hours between exposing the substrate to the plasma in (c) and depositing the metal-containing photoresist in (d). In some embodiments, exposing the substrate to the plasma in (c) only modifies the uppermost 5 Å, or less, of the first material. In various embodiments, exposing the substrate to the plasma in (c) does not cause an increase in formation of photoresist scum when the metal-containing photoresist is developed.

In some cases, particular processing conditions may be used. For instance, in some cases the plasma generation gas source includes carbon dioxide, and the plasma may be generated at a pressure between about 5-100 mTorr and an RF power between about 50-1,000 W. In some cases the plasma generation gas source includes water, and the plasma may generated at a pressure between about 5-300 mTorr and an RF power between about 100-2,000 W. In various implementations, the plasma generation gas source may flow at a rate between about 100-5000 sccm during (b) and (c). In these or other embodiments, (c) may occur at a temperature between about 20-100° C. In some embodiments, the method may further include applying a bias of up to about 100 V on the substrate while the substrate is exposed to the plasma in (c), or while the substrate is exposed to a second plasma prior to (c), where applying the bias on the substrate attracts ions to the surface of the substrate, thereby roughening the surface of the substrate. In some such cases, the bias applied to the substrate may be between about 0-50 V.

In another aspect of the disclosed embodiments, a system for promoting adhesion between a substrate and a metal-containing photoresist is provided, the system including: at least one reaction chamber; at least one plasma generator; at least one inlet for providing gas and/or plasma to the at least one reaction chamber; and a controller having at least one processor, where the at least one processor is configured to control the at least one reaction chamber, the at least one plasma generator, and the at least one inlet to cause any of the methods claimed or otherwise described herein.

In a further aspect of the disclosed embodiments, a system for promoting adhesion between a substrate and a metal-containing photoresist, the system including: at least one reaction chamber; at least one plasma generator; at least one inlet for providing gas and/or plasma to the at least one reaction chamber; and a controller having at least one processor, the at least one processor configured to control the at least one reaction chamber, the at least one plasma generator, and the at least one inlet to cause: (a) receiving the substrate in the at least one reaction chamber, the substrate having a surface including a first material, where the first material includes a silicon-based material and/or a carbon-based material, (b) generating a plasma including chemical functional groups from a plasma generation gas source, (c) providing the plasma to the at least one reaction chamber, where the surface of the substrate is modified by bonds formed between the first material and chemical functional groups from the plasma, and (d) after (c), providing the metal-containing photoresist to the at least one reaction chamber, where the metal-containing photoresist deposits on the modified surface of the substrate, and where the bonds between the first material and chemical functional groups from the plasma promote adhesion between the substrate and the metal-containing photoresist.

In some such embodiments, the at least one processor controls the at least one inlet to provide the plasma and the metal-containing photoresist to one given reaction chamber of the at least one reaction chamber. In other embodiments, the at least one processor controls the at least one inlet to provide the plasma and the metal-containing photoresist to two different chambers of the at least one reaction chamber.

In a further aspect of the disclosed embodiments, a structure is provided, the structure including: a substrate; a first material deposited on the substrate, the first material being silicon-based or carbon-based and including a modified surface including hydroxyl groups; a metal-containing photoresist deposited on the modified surface of the first material, where the metal-containing photoresist and the modified surface form metal-oxygen-silicon bonds and/or metal-oxygen-carbon bonds.

BRIEF DESCRIPTION OF THE DRAWINGS

FIGS. 3A-3C show various chemical species that may be present on and near the substrate surface as the substrate undergoes patterning operations according to an embodiment where the substrate is exposed to plasma generated from water.

Figure 1A:
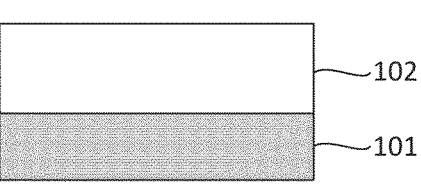
FIGS. 1A-1F show a semiconductor substrate as it undergoes patterning operations, specifically illustrating defect problems that can arise.

DETAILED DESCRIPTION in the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments. The terms resist and photoresist are used interchangeably herein.

Patterning of thin films is often an important step in the fabrication of semiconductors. Patterning involves lithography. In conventional photolithography, such as 193 nm photolithography, patterns are printed by emitting photons from a photon source onto a mask and printing the pattern onto a photosensitive photoresist, thereby causing a chemical reaction in the photoresist that, after development, removes certain portions of the photoresist to form the pattern.

Advanced technology nodes (as defined by the International Technology Roadmap for Semiconductors) include nodes 22 nm, 16 nm, and beyond. In the 16 nm node, for example, the width of a typical via or line in a Damascene structure is typically no greater than about 30 nm. Scaling of features on advanced semiconductor integrated circuits (ICs) and other devices is driving lithography to improve resolution.

Extreme ultraviolet (EUV) lithography can extend lithography technology by moving to smaller imaging source wavelengths than would be achievable with conventional photolithography methods. EUV light sources at approximately 10-20 nm wavelength, or 11-14 nm wavelength, for example 13.5 nm wavelength, can be used for leading-edge lithography tools, also referred to as scanners. The EUV radiation is strongly absorbed in a wide range of solid and fluid materials including quartz and water vapor, and so operates in a vacuum.

EUV lithography makes use of EUV resists that are patternable using EUV light to form masks for use in etching underlying layers. In some cases, EUV resists are polymer-based chemically amplified resists (CARs) produced by liquid-based spin-on techniques. An alternative to CARs are directly photopatternable metal-containing EUV photoresist films. Such resist films may be produced by (wet) spin-on techniques, such as those available from Inpria, Corvallis, OR, and as described, for example, in U.S. Patent Publications US 2017/0102612 and US 2016/0116839, incorporated by reference herein at least for their disclosure of photopatternable metal oxide-containing films, or thy vapor-deposited as described in Application PCT/US19/31618, filed May 9, 2019, and titled METHODS FOR MAKING EUV PATTERNABLE HARD MASKS, the disclosures of which at least relating to the composition and patterning of directly photopatternable metal oxide films to form EUV resist masks is incorporated by reference herein. These directly photopatternable EUV resists may be composed of or contain high-EUV-absorbance metals and their organometallic oxides/hydroxides and other derivatives. Upon EUV exposure, EUV photons as well as secondary electrons generated can induce chemical reactions, such as beta-H elimination reaction in SnOx-based resist (and in other metal-containing resists), and provide chemical functionality to facilitate cross-linking and other changes in the resist film. These chemical changes can then be leveraged in the development step to selectively remove the exposed or unexposed area of the resist film and to create an etch mask for pattern transfer. These organometallic resists are highly promising in that they can enhance the EUV photon adsorption and generate secondary electrons and/or show increased etch selectivity to an underlying film stack and device layers.

Although the techniques herein are presented in the context of patterning applications that use metal-containing resist that is sensitive to EUV radiation, the embodiments are not so limited, Generally, the techniques herein are broadly applicable to various patterning applications that use metal-containing resist. In other words, in various embodiments the metal-containing resist material that is deposited may be sensitive to radiation other than EUV radiation, such as radiation at any conventional lithography wavelength.

Current metal-containing resist materials (as well as other resist materials) often suffer from poor adhesion to underlying layers. The underlying layer may be various materials, for example, amorphous carbon, spin-on-carbon, spin-on-glass, amorphous silicon, silicon oxide, silicon nitride, silicon oxynitride, silicon carbide, silicon oxycarbide, etc. In many cases the underlying layer is a hardmask layer. In various cases, the underlying layer is a silicon-based material or a carbon-based material. Other elements that may be present include, e.g., oxygen, nitrogen, and hydrogen.

To overcome the poor adhesion issue, a relatively thick adhesion layer (sometimes referred to as an underlayer) is often provided between the underlying layer and the resist layer. The adhesion layer promotes high quality adhesion between the underlying layer and the resist layer, thereby reducing the risk that these layers become delaminated during subsequent processing. Alternatively or in addition, in some cases the resist layer can be deposited to include an adhesion promoter within the resist material. In another approach used for traditional chemically amplified resists, the underlying layer may be exposed to a vapor form of hexamethyldisilazane (HMDS) prior to deposition of the resist to promote adhesion between the underlying layer and the resist.

Figure 1B:
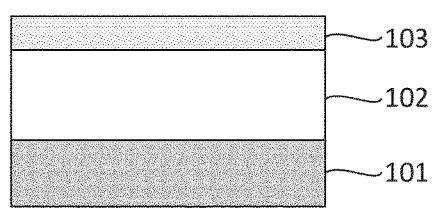
Figure 1C:
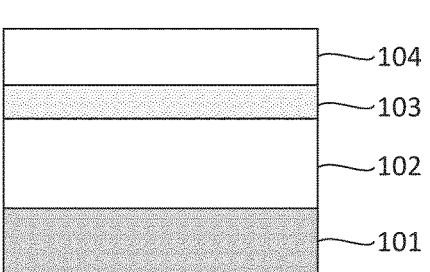
Figure 1D:
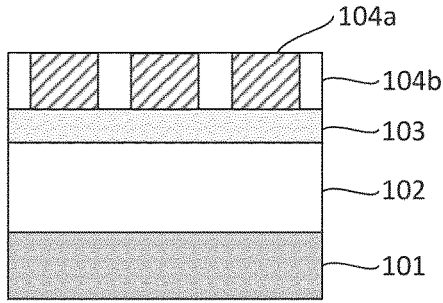
Figure 1E:
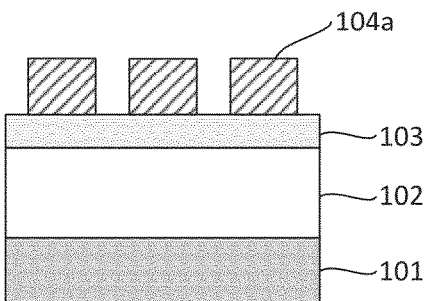
Figure 1F:
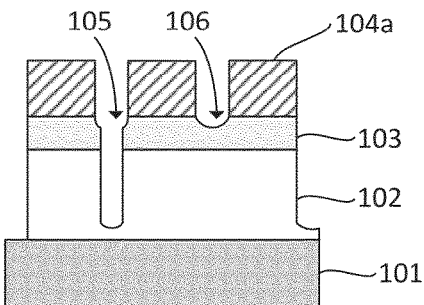

However, these techniques can lead to substantial problems during pattern transfer, as outlined in FIGS. 1A-1F, which depict a partially fabricated semiconductor substrate over the course of several patterning operations. FIG. 1A shows a semiconductor substrate 101 having an underlying layer 102 formed thereon. The underlying layer 102 may include any of the underlying layer materials mentioned above. After the underlying layer 102 is formed on the substrate 101, an adhesion layer 103 is formed on the underlying layer 102, as shown in FIG. 1B. In one example, the adhesion layer 103 is spin-on carbon or spin-on glass, which is deposited at a thickness of about 5-10 nm. Next, the resist layer 104 is deposited on the adhesion layer 103, as shown in FIG. 1C. After the resist layer 104 is deposited, it is exposed to radiation in a lithography operation to form exposed areas 104a and unexposed areas 104b, as shown in FIG. 1D. The resist layer 104 is then developed, thereby removing unexposed areas 104b while the exposed areas 104a remain on the substrate 101, as shown in FIG. 1E. Next, the exposed areas 104a of the resist layer 104 are used as a mask to etch recessed features through the adhesion layer 103 and into the underlying layer 102, as shown in FIG. 1F. In other examples, depending on the materials used, the exposed areas 104a may be removed while the unexposed areas 104b may remain.

In many cases, the presence of adhesion layer 103 causes formation of defects such as foot defect 105 and bridge defect 106, both shown in FIG. 1F. A foot defect 105 may occur when the adhesion layer 103 and the underlying layer 102 are etched, but the etched feature fails to meet sufficient dimension or uniformity requirements. For example, the foot defect 105 shown in FIG. 1F has non-uniform width through the adhesion layer 103, resulting in insufficient width through some depths of the adhesion layer 103 and the underlying layer 102, thereby causing a reduction in the critical dimension of the feature being etched. In such cases, the bottom of the etched feature has a smaller critical dimension than the top of the etched feature, which is not desirable (e.g., because the bottom of the feature is too narrow). A bridge defect 106 may occur when the adhesion layer 103 is not etched through the entire thickness of the adhesion layer 103. Where this occurs, recessed features are prevented from forming in the underlying layer 102. These foot and bridge defects 105 and 106 can cause missing features (e.g., missing vias and holes), as well as incomplete openings and incomplete electrical connections.

In various cases, the foot and bridge defects may form due to insufficient etching of the adhesion layer, which may be a result of photoresist scum. The photoresist scum may be caused by element inter-diffusion between the photoresist and the layer under the photoresist. In some cases where a conventional chemically amplified resist is used, the adhesion layer may be a relatively thin layer formed by exposing the underlying layer to a hexamethyldisilazane (HMDS) vapor prime treatment. The HMDS vapor prime treatment improves adhesion between the underlying layer and the resist layer due to the presence of silicon and/or nitrogen provided by the HMDS. However, the silicon and/or nitrogen from the HMDS (and/or from other adhesion layer materials) can result in substantial photoresist scum after the resist layer is developed. Photoresist scum generally refers to material (e.g., resist material and anything the resist material has reacted with) that is undesirably left behind on a substrate after development of the resist layer. Such material is often left near the bottom, and especially the bottom corners, of recessed features. The photoresist scum frequently causes formation of foot and bridge type defects, for example because the photoresist scum exhibits a slower etch rate than other materials that are being etched at the same time. This can be especially problematic in cases where the underlying material includes carbon or another material that is etched by $O_2$-based chemistry, which is ineffective in removing silicon and nitrogen.

Figure 2A:
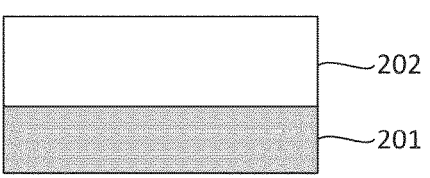
FIGS. 2A-2F depict a semiconductor substrate as it undergoes patterning operations according to various embodiments herein.
Figure 2B:
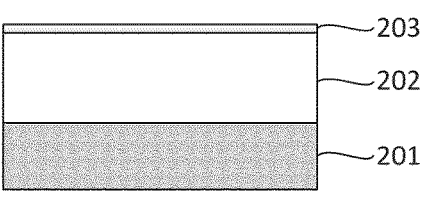

In order to avoid the defect problems associated with the method shown in FIGS. 1A-1F, an alternative surface treatment can be performed to promote adhesion between the underlying layer and the resist layer, without increasing photoresist scum formation. The surface treatment may also have the benefit of lowering dose-to-size, as discussed further below. FIGS. 2A-2F depict an example process. FIG. 2A illustrates substrate 201 with underlying layer 202 formed thereon. Underlying layer 202 may include any of the underlying layer materials discussed above. After the underlying layer 202 is deposited, the substrate 201 is exposed to plasma generated from a plasma generation gas source, thereby forming a thin layer of modified material 203 on the upper surface of the underlying layer 202, as shown in FIG. 2B. The modified material 203 is typically very thin, for example about 1-5 monolayers thick, or about 1-2 monolayers thick. This may correspond to a modified material thickness between about 2-5 Å. The thickness of modified material 203 is greatly exaggerated in FIGS. 2B-2F for the purpose of illustration. In various cases, exposing the substrate to the plasma only modifies the uppermost 5 Å, or less, of the underlying layer 202.

The plasma includes chemical functional groups that modify the surface of the underlying layer 202. Various different types of chemical functional groups may be used. In some embodiments, the plasma generation gas source includes oxygen or other oxygen-containing species, and the plasma includes oxygen radicals and/or oxygen-containing radicals (e.g., O radicals, OH radicals, CO radicals, etc.) that can react with the underlying layer 202. In some embodiments, the plasma generation gas source includes one or more halogen gas such as chlorine ($Cl_2$), bromine ($Br_2$), iodine ($I_2$), etc., and the plasma includes chlorine radicals, bromine radicals, iodine radicals, or a combination thereof. The reaction to form the modified material 203 may be self-limiting.

Exposing the substrate to the plasma can cause formation of bonds between the underlying layer 202 and chemical functional groups in the plasma. For example, in some cases where the underlying layer 202 includes silicon and/or carbon and the plasma generation gas includes oxygen or other oxygen-containing species, exposing the underlying layer 202 to the plasma can cause formation of bonds between (1) the carbon and/or silicon from the underlying layer 202, and (2) the oxygen from the chemical functional groups in the plasma. In other words, exposing the underlying layer 202 to the plasma can cause formation of C—O bonds (in some cases C—OH bonds), Si—O bonds (in some cases Si—OH bonds), or a combination thereof, depending on the material of the underlying layer 202 and the composition of the plasma. Likewise, in some cases where the underlying layer 202 includes silicon and/or carbon and the plasma generation gas includes a halogen gas, exposing the underlying layer 202 to the plasma can cause formation of bonds between (1) the carbon and/or silicon from the underlying layer 202, and (2) the halogen from the chemical functional groups in the plasma. In this case, exposing the underlying layer 202 to the plasma can cause formation of C-halogen bonds (e.g., C—Cl bonds, C—Br bonds, C—I bonds, etc.), Si-halogen bonds (e.g., Si—Cl bonds, Si—Br bonds, Si—I bonds, etc.), or a combination thereof. The plasma treatment creates a very stable bond between the underlying layer 202 and the modified material 203. In some cases, the modified material 203 includes —OH terminations, —O terminations, —Cl terminations, —Br terminations, and/or —I terminations.

In some embodiments, the modified material 203 is further modified after its initial formation, as described further below in relation to FIG. 4C. This further modification may involve converting some or all of the —O terminations (or other terminations present on the substrate surface) to —OH terminations. The further modification may be accomplished by exposing the substrate to moisture (e.g., $H_2O$) and/or to another hydroxyl-containing species. In a particular example, the further modification simply involves ensuring that there is a waiting period (e.g., 3 hours or longer, in some cases 3-24 hours) after exposure of the underlying material 202 to the plasma and before deposition of the resist layer 204, where the substrate is exposed to atmosphere (or other water/hydroxyl-containing environment) during the waiting period.

Figure 2C:
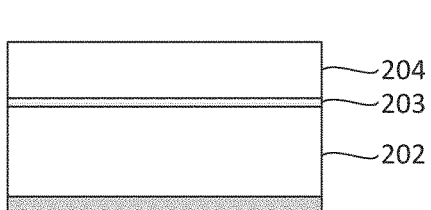

After the modified material 203 is formed, resist layer 204 is deposited, as shown in FIG. 2C. Resist layer 204 is a metal-containing resist material such as those described above. During deposition of the resist layer 204, bonds between the underlying layer 202 and chemical functional groups from the plasma (e.g., oxygen, halogen, etc.) promote adhesion between the substrate (e.g., the carbon and/or silicon in the underlying layer 202) and the resist layer 204 (e.g., the metal atoms in the resist layer 204). For example, in cases where the modified material 203 includes —OH terminations, it is believed that metal from the resist layer 204 (or from a metal-containing precursor used to form resist layer 204) reacts with the —OH terminations in the modified material 203, thereby forming O-metal bonds. For instance, where the underlying layer 202 includes silicon, deposition of the resist layer 204 may result in formation of Si—O-metal bonds. Similarly, where the underlying material 202 includes carbon, deposition of the resist layer may result in formation of C—O-metal bonds. In another example where the modified material 203 includes—halogen terminations, it is believed that the highly reactive—halogen terminations are readily replaced with metal from the resist layer 204 (or with a metal-containing precursor used to form resist layer 204), thereby forming C-metal bonds and/or Si-metal bonds. The bonding structure that forms provides excellent adhesion between the underlying layer 202 and the resist layer 204. Moreover, the excellent adhesion is achieved without introducing additional silicon or nitrogen, which could otherwise cause substantial photoresist scum issues and result in significant defects.

Figure 2D:
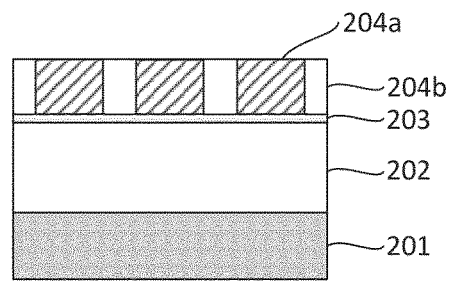
Figure 2E:
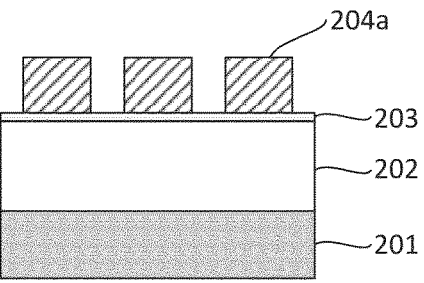
Figure 2F:
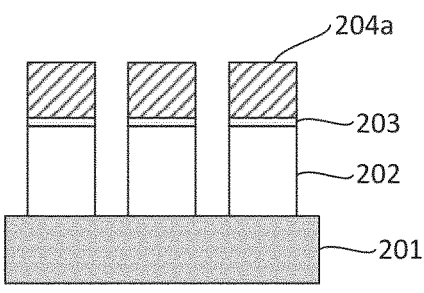

Next, the substrate 201 is exposed to radiation in a lithography operation to form exposed portions 204*a* and unexposed portions 204*b* of resist layer 204, as shown in FIG. 2D. The resist layer 204 is then developed to remove the unexposed portions 204*b* while exposed portions 204*a* remain on the substrate 201, as shown in FIG. 2E. Wet development methods or thy development methods may be used. After development, the recessed features defined by the exposed portions 204a of the resist layer 204 are extended through the modified material 203 and into the underlying material 202, as shown in FIG. 2F. Because the modified material 203 is very thin and is substantially free of silicon and nitrogen, it does not cause the defect problems described in relation to FIG. 1F. This represents a substantial improvement.

In addition to preventing defects as described in relation to FIGS. 1A-F and 2A-F, the techniques described herein may provide a further benefit of lowering dose-to-size. It is generally desirable to create a target amount of cross-linking within the resist layer to achieve acceptable lithography and etching results. Some of this cross-linking may be achieved by exposing the photoresist to EUV radiation. However, it is also generally desirable to minimize the amount of EUV radiation that is delivered to the substrate, for example to lower dose-to-size. The techniques described herein have been shown to advantageously reduce the amount of EUV radiation required to achieve a target degree of cross-linking within the resist layer. These results are further discussed in the Experimental section below.

FIGS. 3A-3C depict an embodiment where the underlying layer is modified by exposing it to plasma generated from water. FIG. 3A shows the materials present on the underlying layer 302 prior to modification. In this particular example, the underlying layer 302 is a carbon-containing ashable hardmask material, though it is understood that other carbon- and silicon-based materials may be used in other cases with similar effects.

FIG. 3B shows the materials that are present on the underlying layer 302 and in nearby plasma 310 during modification while the substrate is exposed to the plasma 310. As mentioned, in this example the plasma 310 is generated from water, and therefore includes $H_2O$, H radicals, and OH radicals, as well as ions. The plasma 310 breaks the C=C bonds on the upper surface of underlying layer 302 and forms reactive CO—OH groups in the a-carbon position.

FIG. 3C shows the materials that are present on the substrate during an initial portion of depositing the resist layer 304 on underlying material 302. In this example, the resist layer 304 is a tin-based organometallic material, though other metal-containing resist materials may be used, as well. As the resist layer 304 is deposited, metal in the metal-containing resist precursor reacts with the CO—OH groups, thereby forming C—O—Sn bonding structures that thoroughly adhere the tin of the resist layer 304 to the carbon of the underlying layer 302. As the full resist layer 304 is deposited, additional cross-linking may occur, for example forming Sn—O—Sn bonding structures. Additional cross-linking may also occur in subsequent bake steps where the resist layer is exposed to elevated temperatures.

In some embodiments where the plasma is generated from water, one or more of the following reaction conditions may be used. The pressure in the reaction chamber may be between about 5-300 mTorr, in some cases between about 100-200 mTorr. The RF power used to generate the plasma may be between about 100-2000 W, in some cases between about 500-1000 W. The water may be provided at a flow rate between about 100-5000 sccm, in some cases between about 100-500 sccm. The substrate may be positioned on a temperature-controlled substrate support. The substrate support may be maintained at a temperature between about 20-100° C. while the substrate is exposed to the plasma, in some cases between about 20-30° C. During the plasma treatment, a bias may be applied to the substrate, for example up to about 50 V. Experimental results relating to such embodiments are discussed in the Experimental section below.

Figure 4A:
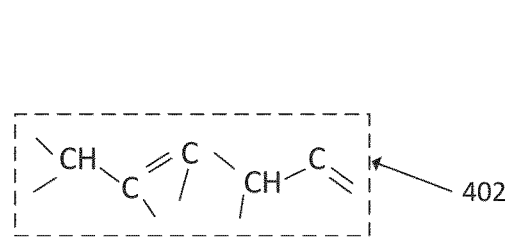
FIGS. 4A-4D show various chemical species that may be present on and near the substrate surface as the substrate undergoes patterning operations according to an embodiment where the substrate is exposed to plasma generated from carbon dioxide.

FIGS. 4A-4D depict an embodiment where the underlying layer is modified by exposing it to plasma generated from carbon dioxide. FIG. 4A shows the materials present on the underlying layer 402 prior to modification. In this example, the underlying layer 402 is a carbon-containing ashable hardmask material, though it is understood that other carbon- and silicon-based materials may be used in other cases with similar effects.

Figure 4B:
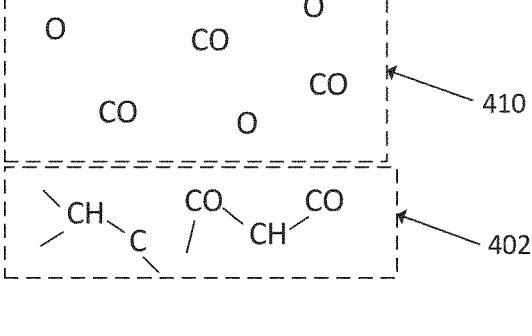

FIG. 4B shows the materials that are present on the underlying layer 402 and in nearby plasma 410 during modification while the substrate is exposed to the plasma 410. The plasma 410 breaks the C=C bonds on the upper surface of the underlying layer 402 and inserts CO groups into the a-carbon position.

Figure 4C:
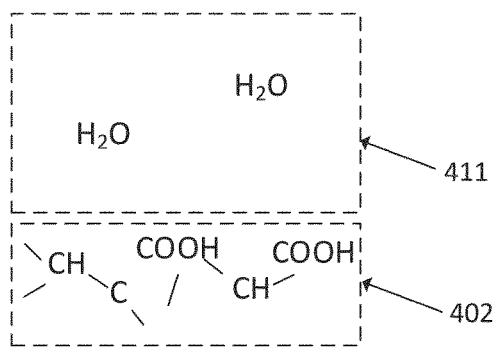

FIG. 4C shows the materials that are present in the underlying layer 402 and the nearby atmosphere 411 during a time period after the underlying layer 402 is exposed to the plasma and before the resist layer 404 is deposited. Moisture ($H_2O$) present in the atmosphere 411 reacts with the CO groups on the surface of underlying layer 402, thereby forming reactive CO—OH groups. As mentioned above, in certain embodiments, a waiting period is used after modification of the underlying layer and prior to deposition of the resist layer to ensure that the underlying layer 402 is adequately saturated with CO—OH groups and/or other hydroxyl terminations.

Figure 4D:
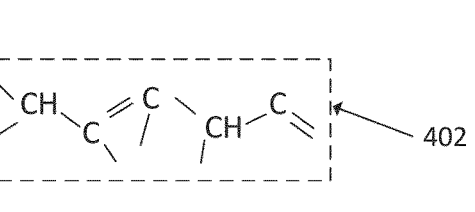

FIG. 4D shows the materials that are present on the substrate during an initial portion of depositing the resist layer 404. In this example, the resist layer 404 is a tin-based organometallic material, though other metal-containing resist materials may be used, as well. As the resist layer 404 is deposited, metal in the metal-containing resist precursor reacts with the CO—OH groups (or other hydroxyl terminations), thereby forming C—O—Sn bonding structures that adhere the tin of the resist layer 404 to the carbon of the underlying layer 402. Additional cross-linking may occur as the full resist layer 404 is deposited, for example forming Sn—O—Sn bonding structures. Additional cross-linking may also occur in subsequent bake steps, as mentioned above.

In some embodiments where the plasma is generated from carbon dioxide, one or more of the following reaction conditions may be used. The pressure in the reaction chamber may be between about 5-100 mTorr, in some cases between about 10-30 mTorr. The RF power used to generate the plasma may be between about 50-1000 W, in some cases between about 100-200 W. The carbon dioxide may be provided at a flow rate between about 100-5000 sccm, in some cases between about 100-500 sccm. The substrate may be positioned on a temperature-controlled substrate support. The substrate support may be maintained at a temperature between about 20-100° C. while the substrate is exposed to the plasma, in some cases between about 20-30° C. During the plasma treatment, a bias may be applied to the substrate, for example up to about 50 V. Experimental results relating to such embodiments are discussed in the Experimental section below.

While example processing conditions have been provided in relation to FIGS. 3A-3C and 4A-4D, it is understood that similar or different processing conditions may be used in other embodiments where the plasma is generated from alternative or additional species (e.g., halogens or other species). Generally speaking, one or more of the following processing conditions may be used in various embodiments, regardless of the composition of the plasma. The pressure in the reaction chamber may be between about 5-500 mTorr, or between about 5-300 mTorr, or between about 5-100 mTorr, or between about 10-30 mTorr, or between about 100-200 mTorr. The RF power used to generate the plasma may be between about 50-3000 W, or between about 50-2000 W, or between about 50-1000 W, or between about 500-1000 W, or between about 100-2000 W, or between about 100-200 W. An optional bias may be applied to the substrate. Where used, the bias may be between about 0-500 V, or between about 0-100 V, or between about 0-50 V. The bias may be at least about 1 V. The plasma may be generated at a duty cycle between about 20%-100%. The gas used to generate the plasma may flow at a rate between about 100-6000 sccm, or between about 100-5000 sccm, or between about 100-1000 sccm, or between about 100-500 sccm. The substrate support may be maintained at a temperature between about 10-120° C., or between about 20-100° C., or between about 20-50° C., or between about 20-30° C. The substrate may be exposed to the plasma over a single continuous period or over multiple discontinuous periods. In some cases, the total duration over which the substrate is exposed to the plasma may be between about 5-60 seconds, or between about 10-20 seconds. In cases where the substrate is exposed to the plasma over multiple discontinuous periods, the duration of each plasma exposure may be between about 1-10 seconds. The number of exposure periods may be between about 1-50.

The processing conditions may be controlled to achieve a desired concentration of —O, —OH, —Cl, —Br, and/or —I terminations on the modified material/underlying layer. For example, pressure, gas flow rates and composition ratios, RF power, temperature, and other processing conditions described above may be controlled for this purpose.

The plasma may be generated in a number of different ways. In some cases, the plasma is generated remotely and then delivered to the chamber/processing space where the substrate is exposed to the plasma. In some cases, the plasma is directly generated in-situ in the chamber/processing space where the substrate is exposed to the plasma. Various different types of plasma may be used. In some cases, the plasma is a capacitively coupled plasma. In some cases, the plasma is an inductively coupled plasma.

The plasma may be generated from a number of different the plasma generation gas sources (e.g., gases/vaporized liquids from which the plasma is generated). FIGS. 3A-3C relate to an embodiment where the plasma generation gas source is water, and FIGS. 4A-4D relate to an embodiment where the plasma generation gas source is carbon dioxide. In another embodiment, the plasma generation gas source may include both water and carbon dioxide. Various other plasma generation gas sources that produce plasmas consisting of desired chemical functional groups may also be used. For example, in some embodiments, the plasma generation gas source may include one or more of water ($H_2O$), carbon dioxide ($CO_2$), carbon monoxide (CO), an alcohol ($C_xH_yOH$, and substituted forms thereof, with particular examples including substituted and unsubstituted forms of methanol, ethanol, propanol, butanol, etc.), diatomic oxygen ($O_2$), ozone ($O_3$), hydrogen peroxide ($H_2O_2$), chlorine ($Cl_2$), bromine ($Br_2$), iodine ($I_2$), etc.

In some embodiments, the plasma generation gas source includes at least one reactive species that includes only oxygen (e.g., $O_2$, $O_3$, etc.). In some embodiments the plasma generation gas source includes at least one reactive species that includes only oxygen and hydrogen (e.g., $H_2O$, $H_2O_2$, etc.). In some embodiments the plasma generation gas source includes at least one reactive species that includes only carbon and oxygen (e.g., CO, $CO_2$, etc.). In some embodiments the plasma generation gas source includes at least one reactive species that includes only carbon, hydrogen, and oxygen (e.g., $C_xH_yOH$, etc.). In many cases the plasma generation gas source includes at least one species that is organic, in some cases the plasma generation gas source includes at least one species that is a diatomic halogen.

In many cases, the plasma generation gas source may further include $H_2$ and/or inert species such as Ar, He, Ne, Kr, Xe, and/or $N_2$. The inert species may become ionized in the plasma, and the ions may bombard the substrate surface to increase surface area and roughness of the underlying layer. This increased surface area/roughness provides additional locations where the metal of the resist layer can adhere to the carbon and/or silicon of the underlying layer, for example through C—O-metal, Si—O-metal, C-metal, and/or Si-metal bonds as described above. The ion bombardment therefore acts to increase the density of these bonds at the interface between the underlying layer and the resist layer, thus strengthening the adhesion between these layers. In some cases, the inert gas and the reactive species in the plasma generation gas source may be provided in the plasma at the same time. In other cases, the substrate may be exposed to a first plasma that includes inert gas, and then to a second plasma that includes the reactive chemical functional groups in the plasma generation gas source, with the two plasmas being provided at different times. Where this is the case, the exposure to inert gas to increase surface area/roughness may occur (1) during deposition of the underlying material (e.g., during at least a final portion of this deposition such that the upper surface of the underlying material is affected), or (2) after deposition of the underlying material and prior to exposure of the substrate to the plasma.

Another technique that may be used to increase surface area to provide additional bonding opportunities is to deposit a thin porous interface layer between the underlying layer and the resist layer. In such cases, the thin porous interface layer is the layer that is modified by the plasma. As such, any details provided herein with respect to modifying an underlying layer may also apply to modifying a thin porous interface layer. In various embodiments, the thin porous interface layer may be a low density amorphous carbon material. In cases where it is used, the thin porous interface may have a thickness between about 2-10 nm, and/or a density between about 1.0-1.3 g/cm$^3$. The thin porous interface layer may be formed through PECVD.

The plasma generation gas source may be substantially free of certain elements that are known to cause photoresist scum and related defects. For instance, the plasma generation gas source may be substantially free of silicon and silicon-containing species. In these or other cases, the plasma generation gas source may be substantially free of reactive nitrogen-containing species. As used herein, the term "substantially free" means that the relevant species is only present at trace amounts, if at all, rather than being intentionally provided. Because the plasma generation gas is substantially free of these species, exposing the substrate to the plasma does not cause an increase in formation of photoresist scum when the metal-containing photoresist is developed. This is very different from other surface modifications involving exposure to HMDS, for example. Because HMDS includes silicon and nitrogen, it results in substantial formation of photoresist scum, leading to the defects shown in FIG. 1F.

One benefit of the techniques herein is breaking the tradeoff between (1) achieving adequate adhesion between the underlying layer and the metal-containing photoresist, and (2) preventing formation of photoresist scum and the associated foot and bridge defects. Prior techniques for promoting adhesion between the relevant layers have relied on silicon-containing materials (in some cases silicon- and nitrogen-containing materials) that often cause photoresist scum and related defects. The plasma treatment described herein promotes high quality adhesion between the underlying layer and the metal-containing photoresist, and it achieves this adhesion without causing formation of photoresist scum or the associated defects. Further, the plasma promotes an increased degree of cross-linking within the metal-containing photoresist, which lowers the amount of EUV radiation required to achieve a desired amount of cross-linking. In other words, the increased cross-linking caused by exposure of the substrate to the plasma advantageously lowers the dose-to-size.

It should also be understood that the while present disclosure relates to lithographic patterning techniques and materials exemplified by EUV lithography, it is also applicable to other next generation lithographic techniques. In addition to EUV, which includes the standard 13.5 nm EUV wavelength currently in use and development, the radiation sources most relevant to such lithography are DUV (deep-UV), which generally refers to use of 248 nm or 193 nm excimer laser sources, X-ray, which formally includes EUV at the lower energy range of the X-ray range, as well as e-beam, which can cover a wide energy range. The specific methods may depend on the particular materials and applications used in the semiconductor substrate and ultimate semiconducting device. Thus, the methods described in this application are merely exemplary of the methods and materials that may be used in present technology.

APPARATUS

The techniques described herein may be performed on a variety of apparatus. The apparatus typically includes at least a reaction chamber; a plasma generator; inlet(s) and outlet(s) for delivering material to the reaction chamber and removing material from the reaction chamber, respectively; a substrate support for supporting the substrate during processing; and a controller configured to cause the methods described herein.

In some embodiments, the reaction chamber may be provided in a standalone tool that is dedicated to exposing the substrate to the plasma. In other embodiments, the reaction chamber may be provided in another tool that is used for other purposes such as deposition, etching, and/or other substrate treatments. In such cases, the reaction chamber may be the same reaction chamber used to perform the deposition, etching, or other substrate treatments, or the reaction chamber may be a different chamber that is physically connected to the rest of the tool via appropriate hardware. In some cases, the reaction chamber may treat a single substrate at a time. In other cases, the reaction chamber may treat multiple substrates at one time. In certain embodiments, the reaction chamber may have multiple stations, each configured to process a substrate simultaneously with the other stations. Many possibilities are available.

In one example, the reaction chamber that is used to expose the substrate to the plasma is the same reaction chamber that is used to deposit the underlying layer. In one example, the reaction chamber may be a chamber configured to perform vapor-based deposition techniques such as chemical vapor deposition and/or atomic layer deposition. In another example, the reaction chamber that is used to expose the substrate to the plasma is the same reaction chamber that is used to deposit the metal-containing photoresist, which may similarly be deposited through vapor-based deposition techniques such as chemical vapor deposition and/or atomic layer deposition, or through wet techniques such as spin-on film. In some cases, deposition of the underlying layer, exposure of the underlying layer to the plasma, and deposition of the metal-containing photoresist may all occur in the same reaction chamber.

Figure 5:
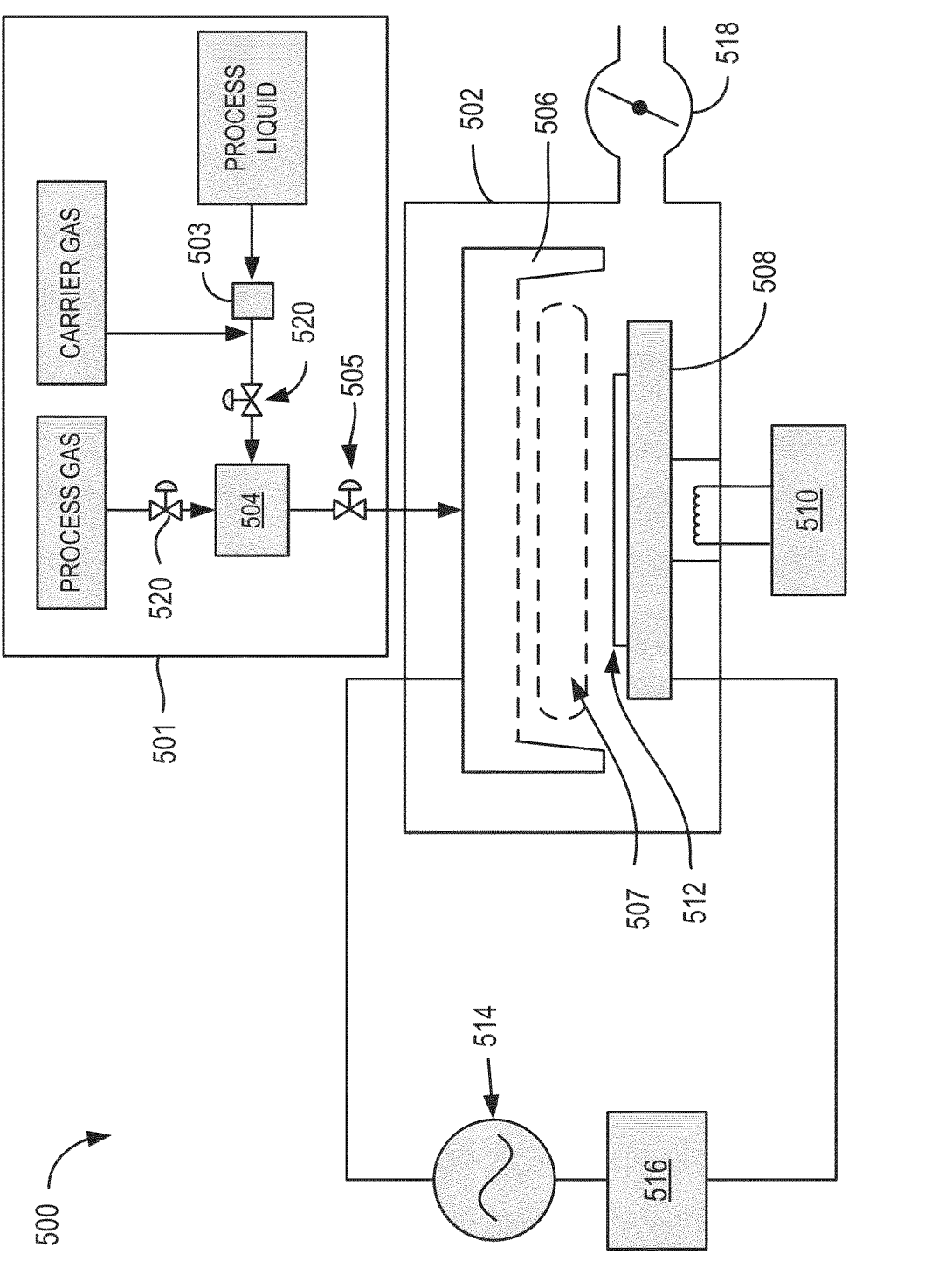
FIG. 5 illustrates a process station that may be used to deposit material and/or expose a substrate to plasma according to various embodiments.

FIGS. 5-9 illustrate various different apparatus that may be used to carry out the techniques described herein. FIG. 5 schematically shows an embodiment of a process station 500 that may be used to expose the substrate to the plasma and/or to deposit material (e.g., the underlying material and/or the metal-containing photoresist) using atomic layer deposition (ALD)) and/or chemical vapor deposition (CVD), either of which may be plasma enhanced. For simplicity, the process station 500 is depicted as a standalone process station having a process chamber body 502 for maintaining a low-pressure environment. However, it will be appreciated that a plurality of process stations 500 may be included in a common process tool environment. Further, it will be appreciated that, in some embodiments, one or more hardware parameters of process station 500, including those discussed in detail below, may be adjusted programmatically by one or more computer controllers.

Process station 500 fluidly communicates with reactant delivery system 501 for delivering process gases to a distribution showerhead 506. Reactant delivery system 501 includes a mixing vessel 504 for blending and/or conditioning process gases for delivery to showerhead 506. One or more mixing vessel inlet valves 520 may control introduction of process gases to mixing vessel 504. Similarly, a showerhead inlet valve 505 may control introduction of process gasses to the showerhead 506.

Some reactants, like BTBAS, may be stored in liquid form prior to vaporization at and subsequent delivery to the process station. For example, the embodiment of FIG. 5 includes a vaporization point 503 for vaporizing liquid reactant to be supplied to mixing vessel 504. In some embodiments, vaporization point 503 may be a heated vaporizer. The reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 503 may be heat traced. In some examples, mixing vessel 504 may also be heat traced. In one non-limiting example, piping downstream of vaporization point 503 has an increasing temperature profile extending from approximately 100° C. to approximately 150° C. at mixing vessel 504.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 503. In one scenario, a liquid injector may be mounted directly to mixing vessel 504. In another scenario, a liquid injector may be mounted directly to showerhead 506.

In some embodiments, a liquid flow controller upstream of vaporization point 503 may be provided for controlling a mass flow of liquid for vaporization and delivery to process station 500. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LTC and the PID controller.

Showerhead 506 distributes process gases toward substrate 512. In the embodiment shown in FIG. 5, substrate 512 is located beneath showerhead 506, and is shown resting on a pedestal 508. It will be appreciated that showerhead 506 may have any suitable shape, and may have any suitable number and arrangement of ports for distributing processes gases to substrate 512.

In some embodiments, a microvolume 507 is located beneath showerhead 506. Performing an plasma exposure, ALD and/or CVD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters. This microvolume also impacts productivity throughput. While deposition rate per cycle drops, the cycle time also simultaneously reduces. In certain cases, the effect of the latter is dramatic enough to improve overall throughput of the module for a given target thickness of film.

In some embodiments, pedestal 508 may be raised or lowered to expose substrate 512 to microvolume 507 and/or to vary a volume of microvolume 507. For example, in a substrate transfer phase, pedestal 508 may be lowered to allow substrate 512 to be loaded onto pedestal 508. During a deposition process phase or a plasma exposure process phase, pedestal 508 may be raised to position substrate 512 within microvolume 507. In some embodiments, microvolume 507 may completely enclose substrate 512 as well as a portion of pedestal 508 to create a region of high flow impedance during a substrate processing operation.

Optionally, pedestal 508 may be lowered and/or raised during portions the process to modulate process pressure, reactant concentration, etc., within microvolume 507. In one scenario where process chamber body 502 remains at a base pressure during the process, lowering pedestal 508 may allow microvolume 507 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller.

In another scenario, adjusting a height of pedestal 508 may allow a plasma density to be varied during plasma activation and/or treatment operations included in the process. At the conclusion of the relevant process phase, pedestal 508 may be lowered during another substrate transfer phase to allow removal of substrate 512 from pedestal 508.

While the example microvolume variations described herein refer to a height-adjustable pedestal, it will be appreciated that, in some embodiments, a position of showerhead 506 may be adjusted relative to pedestal 508 to vary a volume of microvolume 507, Further, it will be appreciated that a vertical position of pedestal 508 and/or showerhead 506 may be varied by any suitable mechanism within the scope of the present disclosure. In some embodiments, pedestal 508 may include a rotational axis for rotating an orientation of substrate 512. It will be appreciated that, in some embodiments, one or more of these example adjustments may be performed programmatically by one or more suitable computer controllers.

Returning to the embodiment shown in FIG. 5, showerhead 506 and pedestal 508 electrically communicate with RF power supply 514 and matching network 516 for powering a plasma, such as the plasma used to modify the underlying material, and any plasma used during other processing steps in the same chamber. In some embodiments, the plasma energy may be controlled by controlling one or more of a process station pressure, a gas concentration, an RF source power, an RF source frequency, and a plasma power pulse timing. For example, RF power supply 514 and matching network 516 may be operated at any suitable power to form a plasma having a desired composition of radical species. Examples of suitable powers are included above. Likewise, RF power supply 514 may provide RF power of any suitable frequency. In some embodiments, RF power supply 514 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on Iti measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma process phase may be included in a corresponding plasma activation recipe phase of a deposition process recipe. In some cases, process recipe phases may be sequentially arranged, so that all instructions for a deposition process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations, much shorter plasma strikes may be used. These may be on the order of 10 ms to 1 second, typically, about 20 to 80 ms, with 50 ms being a specific example. Such very short RF plasma strikes require extremely quick stabilization of the plasma. To accomplish this, the plasma generator may be configured such that the impedance match is set preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with some types of deposition or other treatment cycles.

In some embodiments, pedestal 508 may be temperature controlled via heater 510. Further, in some embodiments, pressure control for deposition process station 500 may be provided by butterfly valve 518. As shown in the embodiment of FIG. 5, butterfly valve 518 throttles a vacuum provided by a downstream vacuum pump (not shown). However, in some embodiments, pressure control of process station 500 may also be adjusted by varying a flow rate of one or more gases introduced to process station 500.

Figure 6:
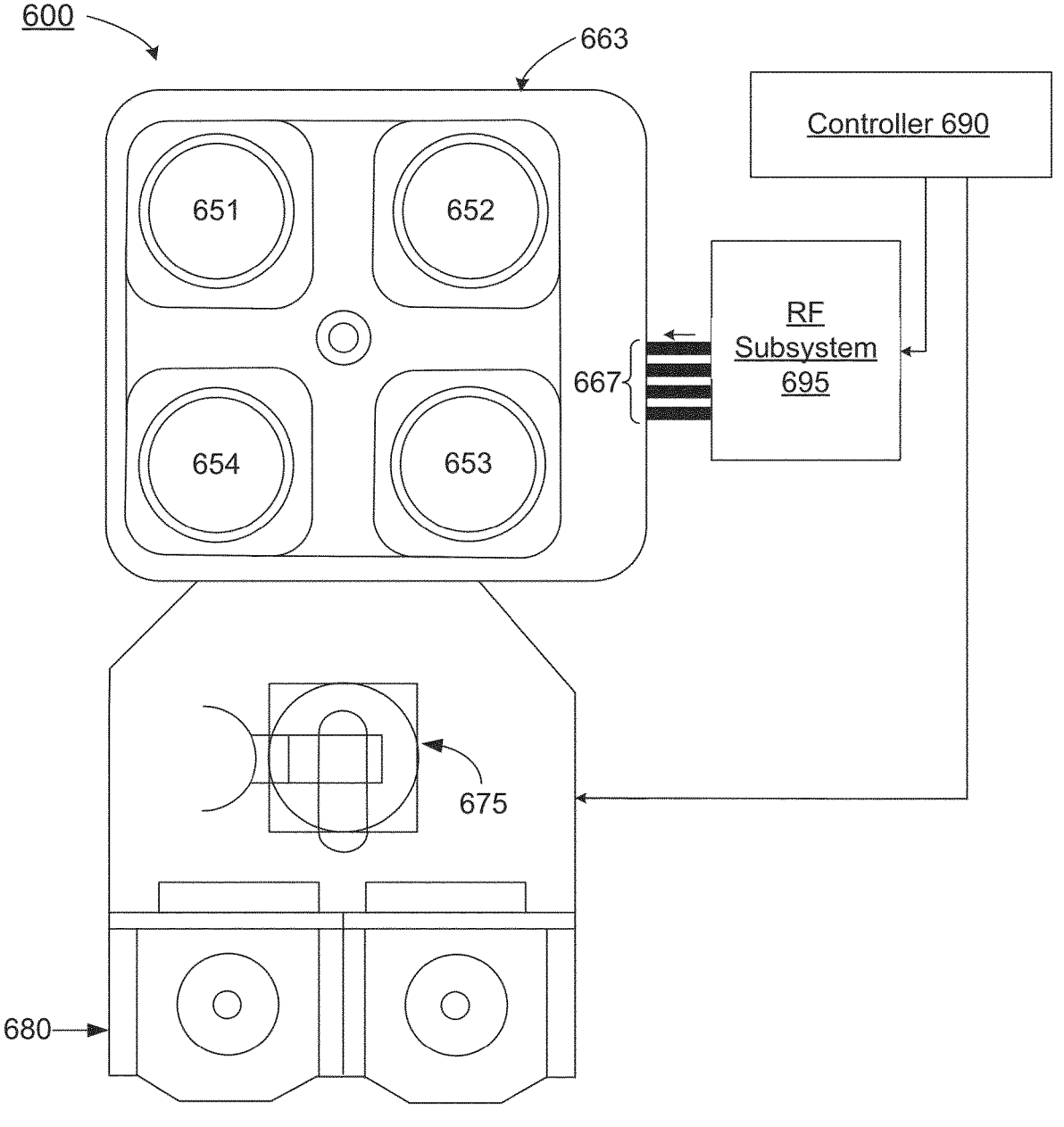
FIGS. 6 and 7 depict multi-station processing tools that may be used to deposit material, expose a substrate to plasma, and/or perform other operations described herein.

It may be appreciated that a plurality of process stations may be included in a multi-station processing tool environment, such as shown in FIG. 6, which depicts a schematic view of an embodiment of a multi-station processing tool. Processing apparatus 600 employs an integrated circuit fabrication chamber 663 that includes multiple fabrication process stations, each of which may be used to perform processing operations on a substrate held in a wafer holder, such as a pedestal, at a particular process station. In the embodiment of FIG. 6, the integrated circuit fabrication chamber 663 is shown having four process stations 651, 652, 653, and 654, Other similar multi-station processing apparatuses may have more or fewer process stations depending on the implementation and, for example, a desired level of parallel wafer processing, size/space constraints, cost constraints, etc. Also shown in FIG. 6 is substrate handler robot 675, which may operate under the control of system controller 690, configured to move substrates from a wafer cassette (not shown in FIG. 6) from loading port 680 and into integrated circuit fabrication chamber 663, and onto one of process stations 651, 652, 653, and 654.

FIG. 6 also depicts an embodiment of a system controller 690 employed to control process conditions and hardware states of processing apparatus 600. System controller 690 may include one or more memory devices, one or more mass storage devices, and one or more processors, as described herein.

RF subsystem 695 may generate and convey RF power to integrated circuit fabrication chamber 663 via radio frequency input ports 667. In particular embodiments, integrated circuit fabrication chamber 663 may comprise input ports in addition to radio frequency input ports 667 (additional input ports not shown in FIG. 6). Accordingly, integrated circuit fabrication chamber 663 may utilize 8 RF input ports. In particular embodiments, process stations 651-654 of integrated circuit fabrication chamber 165 may each utilize first and second input ports in which a first input port may convey a signal having a first frequency and in which a second input port may convey a signal having a second frequency. Use of dual frequencies may bring about enhanced plasma characteristics.

Figure 7:
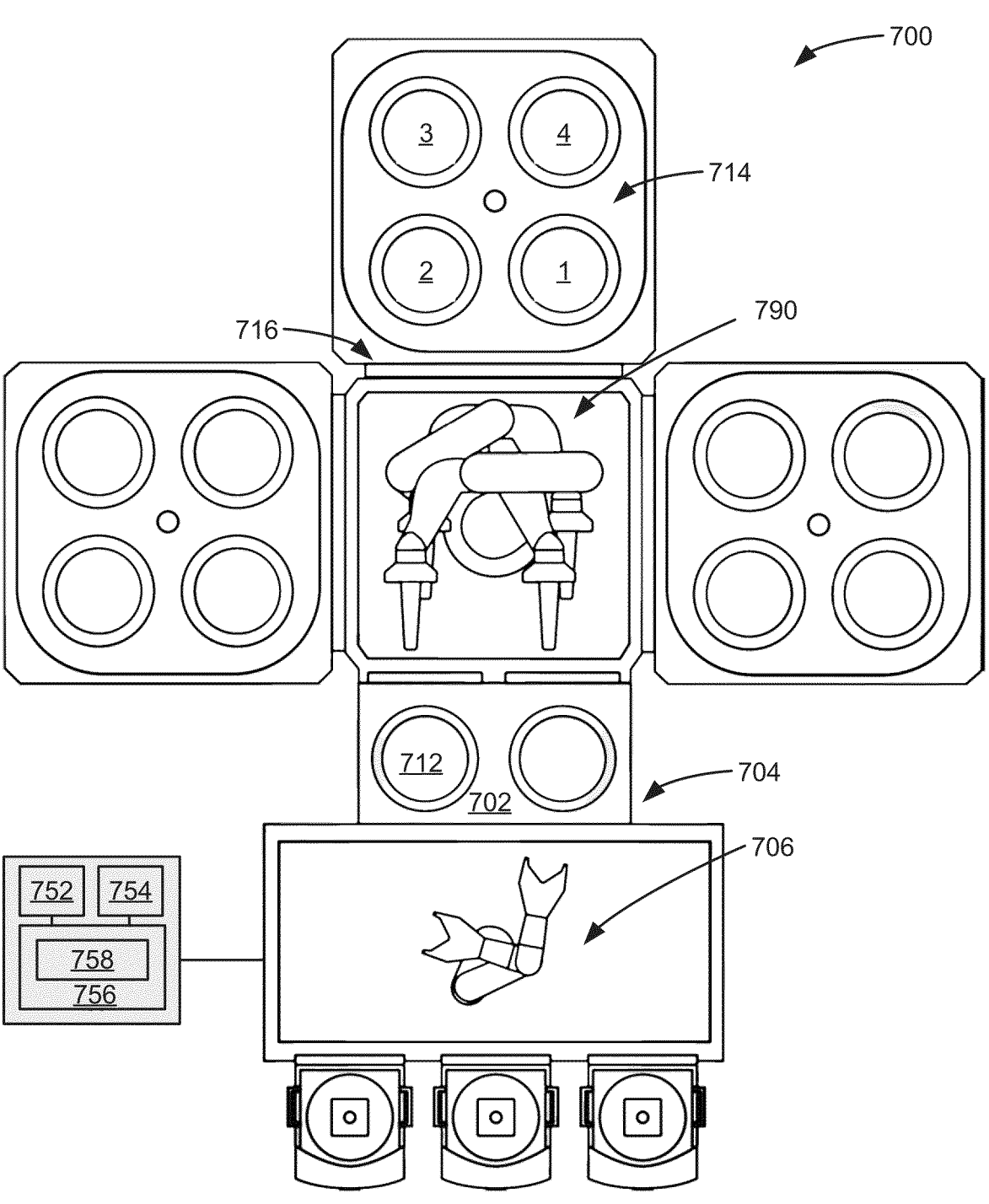

As described above, one or more process stations may be included in a multi-station processing tool. FIG. 7 shows a schematic view of an embodiment of a multi-station processing tool 700 with an inbound load lock 702 and an outbound load lock 704, either or both of which may comprise a remote plasma source. A robot 706, at atmospheric pressure, is configured to move substrates or wafers from a cassette loaded through a pod 708 into inbound load lock 702 via an atmospheric port 710. A substrate is placed by the robot 706 on a pedestal 712 in the inbound load lock 702, the atmospheric port 710 is closed, and the load lock is pumped down. Where the inbound load lock 702 comprises a remote plasma source, the substrate may be exposed to a remote plasma treatment in the load lock prior to being introduced into a processing chamber 714. Further, the substrate also may be heated in the inbound load lock 702 as well, for example, to remove moisture and adsorbed gases. Next, a chamber transport port 716 to processing chamber 714 is opened, and another robot (not shown) places the substrate into the reactor on a pedestal of a first station shown in the reactor for processing. While the embodiment depicted in FIG. 7 includes load locks, it will be appreciated that, in some embodiments, direct entry of a substrate into a process station may be provided. In various embodiments, the soak gas is introduced to the station when the substrate is placed by the robot 706 on the pedestal 712.

The depicted processing chamber 714 comprises four process stations, numbered from 1 to 4 in the embodiment shown in FIG. 7. Each station has a heated pedestal (shown at 718 for station 1), and gas line inlets. It will be appreciated that in some embodiments, each process station may have different or multiple purposes. For example, in some embodiments, a process station may be switchable between an ALD and PEALD process mode, or between a plasma treatment mode and a deposition mode. Additionally or alternatively, in some embodiments, processing chamber 714 may include one or more matched pairs of plasma treatment stations and deposition stations. While the depicted processing chamber 714 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 7 depicts an embodiment of a wafer handling system 790 for transferring substrates within processing chamber 714. In some embodiments, wafer handling system 790 may transfer substrates between various process stations and/or between a process station and a load lock. It will be appreciated that any suitable wafer handling system may be employed. Non-limiting examples include wafer carousels and wafer handling robots. FIG. 7 also depicts an embodiment of a system controller 750 employed to control process conditions and hardware states of process tool 700. System controller 750 may include one or more memory devices 756, one or more mass storage devices 754, and one or more processors 752. Processor 752 may include a CPU or computer, analog and/or digital input/output connections, stepper motor controller boards, etc. In some embodiments, system controller 750 includes machine-readable instructions for performing operations such as those described herein.

In some embodiments, system controller 750 controls the activities of process tool 700. System controller 750 executes system control software 758 stored in mass storage device 754, loaded into memory device 756, and executed on processor 752. Alternatively, the control logic may be hard coded in the system controller 750. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 758 may include instructions for controlling the timing, mixture of gases, amount of gas flow, chamber and/or station pressure, chamber and/or station temperature, substrate temperature, target power levels, RF power levels, substrate pedestal, chuck and/or susceptor position, and other parameters of a particular process performed by process tool 700. System control software 758 may be configured in any suitable way. For example, various process tool component subroutines or control objects may be written to control operation of the process tool components used to carry out various process tool processes. System control software 758 may be coded in any suitable computer readable programming language.

Figure 8:
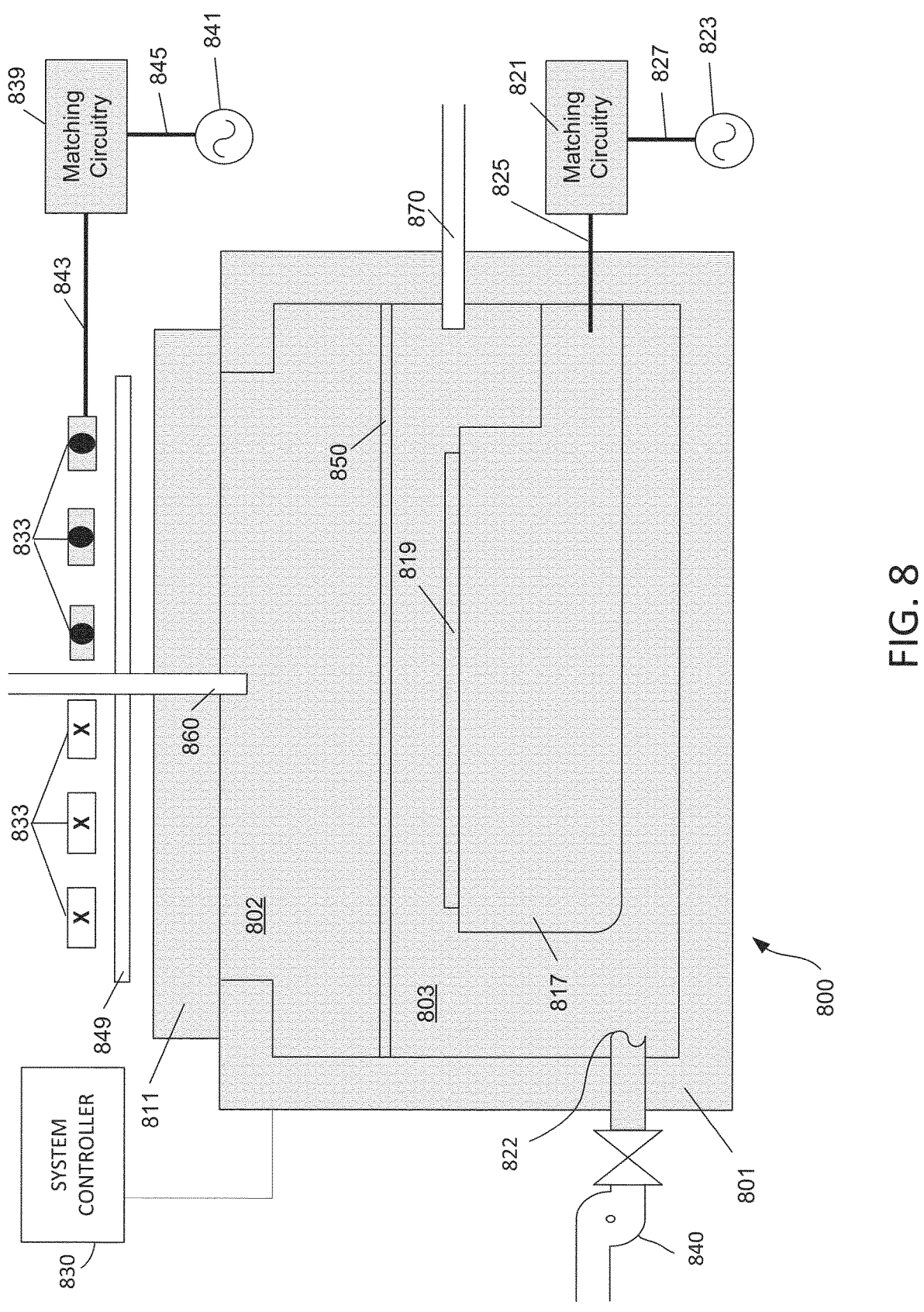
FIG. 8 depicts an inductively coupled plasma processing apparatus that may be used to expose a substrate to plasma and/or perform other operations described herein.

FIG. 8 schematically shows a cross-sectional view of an inductively coupled plasma processing apparatus 800 in accordance with certain embodiments herein. A Kiyo™ reactor, produced by Lam Research Corp. of Fremont, CA, is an example of a suitable reactor that may be used to implement the techniques described herein. The inductively coupled plasma processing apparatus 800 includes an overall processing chamber structurally defined by chamber walls 801 and a window 811. The chamber walls 801 may be fabricated from stainless steel or aluminum. The window 811 may be fabricated from quartz or other dielectric material. An optional internal plasma grid 850 divides the overall processing chamber into an upper sub-chamber 802 and a lower sub-chamber 803. The plasma grid 850 may include a single grid or multiple individual grids. In many embodiments, plasma grid 850 may be removed, thereby utilizing a chamber space made of sub-chambers 802 and 803.

A chuck 817 is positioned within the lower sub-chamber 803 near the bottom inner surface. The chuck 817 is configured to receive and hold a semiconductor wafer 819. The chuck 817 can be an electrostatic chuck for supporting the wafer 819 when present. In some embodiments, an edge ring (not shown) surrounds chuck 817, and has an upper surface that is approximately planar with a top surface of a wafer 819, when present over chuck 817. The chuck 817 also includes electrostatic electrodes for chucking and dechucking the wafer. A filter and DC clamp power supply (not shown) may be provided for this purpose, Other control systems for lifting the wafer 819 off the chuck 817 can also be provided. The chuck 817 can be electrically charged using an RF power supply 823. The RF power supply 823 is connected to matching circuitry 821 through a connection 827. The matching circuitry 821 is connected to the chuck 817 through a connection 825. In this manner, the RF power supply 823 is connected to the chuck 817.

A coil 833 is positioned above window 811. The coil 833 is fabricated from an electrically conductive material and includes at least one complete turn. The exemplary coil 833 shown in FIG. 8 includes three turns. The cross-sections of coil 833 are shown with symbols, and coils having an "X" extend rotationally into the page, while coils having a "●" extend rotationally out of the page. An RF power supply 841 is configured to supply RF power to the coil 833. In general, the RF power supply 841 is connected to matching circuitry 839 through a connection 845. The matching circuitry 839 is connected to the coil 833 through a connection 843. In this manner, the RF power supply 841 is connected to the coil 833. An optional Faraday shield 849 is positioned between the coil 833 and the window 811. The Faraday shield 849 is maintained in a spaced apart relationship relative to the coil 833. The Faraday shield 849 is disposed immediately above the window 811. The coil 833, the Faraday shield 849, and the window 811 are each configured to be substantially parallel to one another. The Faraday shield may prevent metal or other species from depositing on the dielectric window of the plasma chamber.

Process gases may be supplied through a main injection port 860 positioned in the upper chamber and/or through a side injection port 870, sometimes referred to as an STG. A vacuum pump, e.g., a one or two stage mechanical dry pump and/or turbomolecular pump 840, may be used to draw process gases out of the process chamber and to maintain a pressure within the plasma processing apparatus 800 by using a closed-loop-controlled flow restriction device, such as a throttle valve (not shown) or a pendulum valve (not shown), during operational plasma processing.

During operation of the apparatus, one or more reactant gases may be supplied through injection ports 860 and/or 870. In certain embodiments, gas may be supplied only through the main injection port 860, or only through the side injection port 870. In some cases, the injection ports may be replaced by showerheads. The Faraday shield 849 and/or optional grid 850 may include internal channels and holes that allow delivery of process gases to the chamber. Either or both of Faraday shield 849 and optional grid 850 may serve as a showerhead for delivery of process gases.

Radio frequency power is supplied from the RF power supply 841 to the coil 833 to cause an RE current to flow through the coil 833. The RF current flowing through the coil 833 generates an electromagnetic field about the coil 833. The electromagnetic field generates an inductive current within the upper sub-chamber 802. The physical and chemical interactions of various generated ions and radicals with the wafer 819 selectively etch or otherwise process features of the wafer.

If the plasma grid 850 is used such that there is both an upper sub-chamber 802 and a lower sub-chamber 803, the inductive current acts on the gas present in the upper sub-chamber 802 to generate an electron-ion plasma in the upper sub-chamber 802. The optional internal plasma grid 850, if present, may act to limit the number of hot electrons in the lower sub-chamber 803. In some embodiments, the apparatus is designed and operated such that the plasma present in the lower sub-chamber 803 is an ion-ion plasma. In other embodiments, the apparatus may be designed and operated such that the plasma present in the lower sub-chamber 803 is an electron-ion plasma. Internal plasma grids and ion-ion plasma are further discussed in U.S. patent application Ser. No. 14/082,009, filed Nov. 15, 2013, and titled "INTERNAL PLASMA GRID FOR SEMICONDUCTOR FABRICATION," and in U.S. Pat. No. 9,245,761, each of which is herein incorporated by reference in its entirety.

Volatile byproducts may be removed from the lower-sub chamber 803 through port 822. The chuck 817 disclosed herein may operate at elevated temperatures ranging between about 30° C. and about 250° C. In some cases, the chuck 817 may also operate at lower temperatures, for example when the chuck 817 is actively chilled. In such cases the chuck 817 may operate at substantially lower temperatures, as desired. The temperature will depend on the process operation and specific recipe. In some embodiments, the chamber 801 may operate at pressures in the range of between about 1 mTorr and about 95 mTorr. In certain embodiments, the pressure may be higher.

Chamber 801 may be coupled to facilities (not shown) when installed in a clean room or a fabrication facility. Facilities include plumbing that provide processing gases, vacuum, temperature control, and environmental particle control. These facilities are coupled to chamber 801, when installed in the target fabrication facility. Additionally, chamber 801 may be coupled to a transfer chamber that allows robotics to transfer semiconductor wafers into and out of chamber 801 using typical automation.

In some embodiments, a system controller 830 (which may include one or more physical or logical controllers) controls some or all of the operations of a processing chamber. The system controller 830 may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the system controller 830 or they may be provided over a network. In certain embodiments, the system controller 830 executes system control software.

In some cases, the system controller 830 controls gas concentration, wafer movement, and/or the power supplied to the coils 833 and/or electrostatic chuck 817. The system controller 830 may control the gas concentration by, for example, opening and closing relevant valves to produce one or more inlet gas stream that provide the necessary reactant(s) at the proper concentration(s). The wafer movement may be controlled by, for example, directing a wafer positioning system to move as desired. The power supplied to the coils 833 and/or chuck 817 may be controlled to provide particular RF power levels. Similarly, if the internal grid 850 is used, any. RF power applied to the grid may be adjusted by the system controller 830.

The system controller 830 may control these and other aspects based on sensor output (e.g., when power, potential, pressure, etc. reach a certain threshold), the timing of an operation (e.g., opening valves at certain times in a process), or based on received instructions from the user. An example controller is further discussed below.

Figure 9:
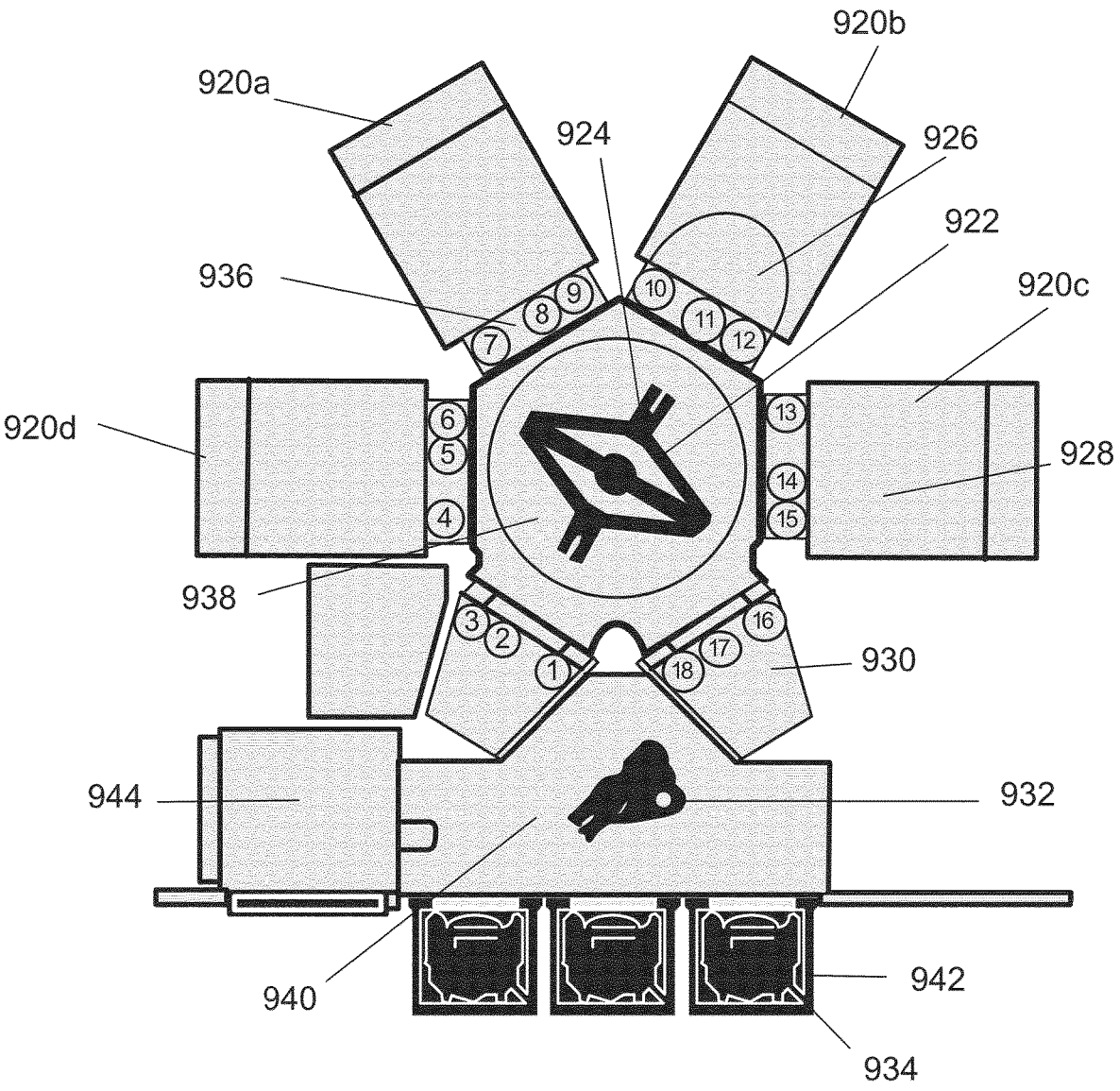
FIG. 9 depicts a semiconductor process cluster architecture with various modules that may be configured to expose a substrate to plasma and/or perform other operations described herein.

FIG. 9 depicts a semiconductor process cluster architecture with various modules that interface with a vacuum transfer module 938 (VTM). The arrangement of transfer modules to "transfer" wafers among multiple storage facilities and processing modules may be referred to as a "cluster tool architecture" system. Airlock 930, also known as a loadlock or transfer module, is shown in VTM 938 with four processing modules 920*a*-920*d*, which may be individually optimized to perform various fabrication processes. By way of example, processing modules 920*a*-920*d* may be implemented to perform substrate exposure to plasma, etching, deposition, ion implantation, wafer cleaning, sputtering, and/or other semiconductor processes. One or more of the processing modules (any of 920*a*-920*d*) may be implemented as disclosed herein, and may be used to expose the substrate to the plasma, deposit materials, and/or etch materials as described herein. Airlock 930 and process module 920 may be referred to as "stations." Each station has a facet 936 that interfaces the station to VTM 938. Inside each facet, sensors 1-18 are used to detect the passing of wafer 926 when moved between respective stations.

Robot 922 transfers wafer 926 between stations. In one embodiment, robot 922 has one arm, and in another embodiment, robot 922 has two arms, where each arm has an end effector 924 to pick wafers such as wafer 926 for transport. Front-end robot 932, in atmospheric transfer module (ATM) 940, is used to transfer wafers 926 from cassette or Front Opening Unified Pod (FOUP) 934 in Load Port Module (LPM) 942 to airlock 930. Module center 928 inside process module 920 is one location for placing wafer 926. Aligner 944 in ATM 940 is used to align wafers.

In an exemplary processing method, a wafer is placed in one of the FOUPs 934 in the LPM 942. Front-end robot 932 transfers the wafer from the FOUP 934 to an aligner 944, which allows the wafer 926 to be properly centered before it is etched or processed. After being aligned, the wafer 926 is moved by the front-end robot 932 into an airlock 930. Because airlock modules have the ability to match the environment between an ATM and a VTM, the wafer 926 is able to move between the two pressure environments without being damaged. From the airlock module 930, the wafer 926 is moved by robot 922 through VIM 938 and into one of the process modules 920*a*-920*d*. In order to achieve this wafer movement, the robot 922 uses end effectors 924 on each of its arms. Once the wafer 926 has been processed, it is moved by robot 922 from the process modules 920*a*-920*d* to an airlock module 930. From here, the wafer 926 may be moved by the front-end robot 932 to one of the FOUPs 934 or to the aligner 944.

It should be noted that the computer controlling the wafer movement can be local to the cluster architecture, or can be located external to the cluster architecture in the manufacturing floor, or in a remote location and connected to the cluster architecture via a network.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a tab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma treatment chamber or module, a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CND) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

EXPERIMENTAL

Figure 10:
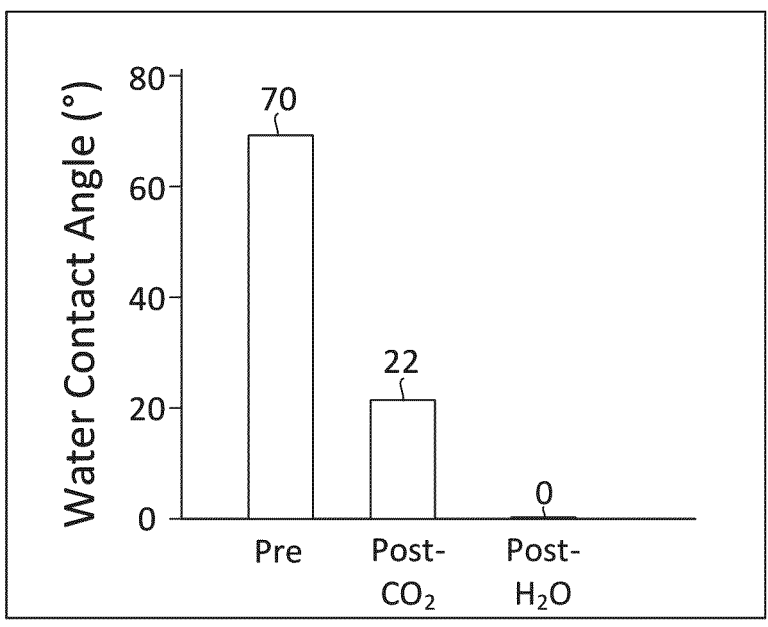
FIG. 10 illustrates experimental results examining the effect of different plasma treatments on water contact angle.

FIG. 10 presents experimental results related to the effect of exposing the substrate to different plasma treatments. Specifically, FIG. 10 describes the effect of the different plasma treatments on the water contact angle. The water contact angle is a measure of the hydrophilicity of the relevant surface, which also indicates the relative concentration of hydroxyl groups present on the substrate surface. Lower water contact angle indicates greater hydrophilicity and a greater concentration of hydroxyl groups on the substrate surface. In these examples, the underlying layers that were modified through exposure to the plasmas were carbon-based ashable hardmask materials.

Prior to exposing the substrates to the plasmas, the substrates exhibited a water contact angle of about 70°, which indicates a highly hydrophobic surface. This data is indicated in the "Pre" result of FIG. 10. The "Post-$CO_2$" result is the water contact angle after exposing a substrate to a plasma generated from carbon dioxide. In this case, the water contact angle was reduced from about 70° to about 22°. The "Post-$H_2O$" result is the water contact angle after exposing a substrate to a plasma generated from water. In this case, the water contact angle was reduced from about 70° to 0°. Both of the plasma treatments resulted in substantial decreases in the water contact angle, indicating that the surfaces became significantly more hydrophilic due to modifications on the substrate surface during the plasma exposure.

Figure 11:
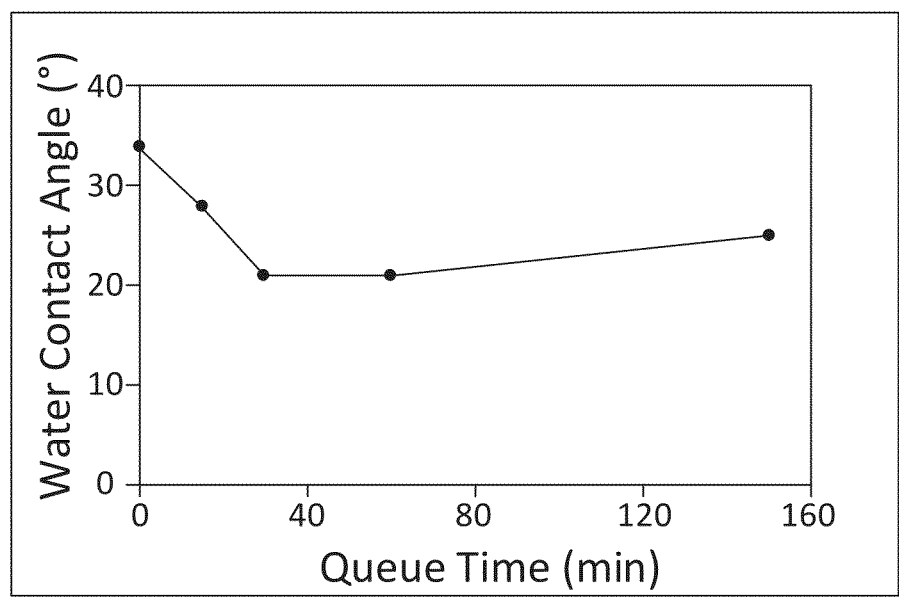
FIG. 11 illustrates experimental results examining the effect of time on water contact angle following a carbon dioxide-based plasma treatment.

FIG. 11 presents experimental data examining the effect of queue time on the water contact angle following a plasma treatment where the substrate was exposed to a plasma generated from carbon dioxide. In this example, the water contact angle decreased over the course of the first ~35 minutes of queue time, and then began to increase. Without wishing to be bound by theory or mechanism of action, it is believed that the initial decrease in the water contact angle after the substrate is exposed to the carbon dioxide-based plasma results from increased adsorption of moisture from the environment onto the modified material on the substrate surface, as described in relation to FIG. 4C. The moisture effectively converts many CO groups on the substrate surface into more reactive CO—OH groups. The CO—OH groups provide greater hydrophilicity than the CO groups, thus resulting in the decreased water contact angle over the initial portion of the queue time. As noted above, in certain embodiments, a waiting period may be introduced between exposure of the substrate to the plasma and deposition of the metal-containing photoresist, such that the metal-containing photoresist is deposited when the substrate surface is substantially saturated with hydroxyl groups. In other embodiments, the substrate can be exposed to water vapor after exposure to plasma to saturate the surface of the substrate with hydroxyl groups.

Figure 12:
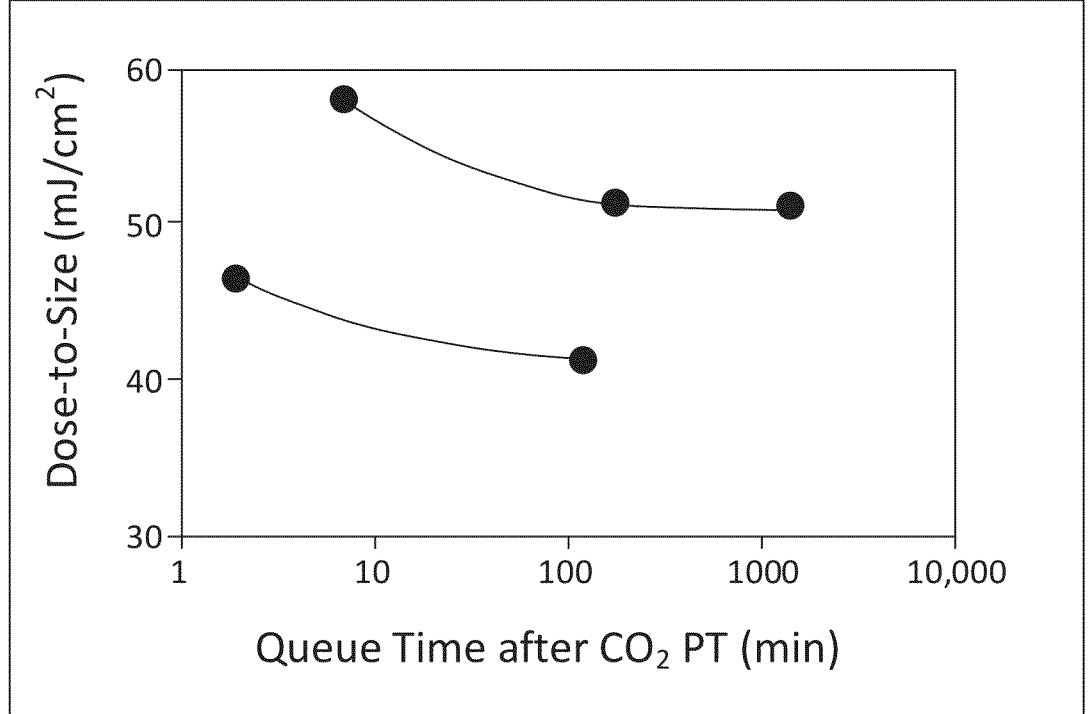
FIG. 12 illustrates experimental results examining the effect of time on dose-to-size following a carbon dioxide-based plasma treatment.

FIG. 12 illustrates experimental data examining the effect of queue time on dose-to-size following a plasma treatment where the substrate was exposed to a plasma generated from carbon dioxide. The results are shown for two different substrates. In each case, the dose-to-size decreased over time after exposure to the carbon dioxide-based plasma. As explained in relation to FIG. 11, it is believed that the moisture present in the atmosphere to which the substrate is exposed during the queue time adsorbs onto the substrate surface, thereby converting many CO groups into more reactive CO—OH groups. Because these groups are more reactive, they promote increased cross-linking with the metal-containing photoresist, and thus, the dose of EUV radiation required to achieve a desired degree of cross-linking is reduced. It is expected that water-based plasma treatments would have the same effect as shown in FIGS. 11 and 12, without any need to wait between the plasma treatment and deposition of the metal-containing photoresist, since the water-based plasma treatment would have the effect of saturating the substrate surface with the desired CO—OH groups. It is also expected that these same results would be seen on silicon-based underlying materials (e.g., substituting silicon for carbon, where appropriate).

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of promoting adhesion between a substrate and a metal-containing photoresist, the method comprising:
   (a) providing the substrate having a surface comprising a first material, the first material comprising a silicon-based material and/or a carbon-based material;
   (b) generating a plasma from a plasma generation gas source, wherein the plasma generation gas source comprises one or more of alcohol vapor, carbon monoxide, and carbon dioxide;
      wherein the plasma generation gas source is substantially free of silicon, and wherein the plasma comprises chemical functional groups;
   (c) exposing the substrate to the plasma to modify the surface of the substrate by forming bonds between the first material and chemical functional groups from the plasma; and
   (d) after (c), depositing the metal-containing photoresist on the modified surface of the substrate, wherein the bonds between the first material and the chemical functional groups from the plasma promote adhesion between the substrate and the metal-containing photoresist.

2. The method of claim 1, wherein the plasma generation gas source further comprises water vapor.

3. The method of claim 1, wherein the plasma generation gas source further comprises at least one species that is organic.

4. The method of claim 1, wherein the plasma generation gas source comprises carbon dioxide.

5. The method of claim 1, wherein the plasma generation gas source comprises carbon monoxide.

6. The method of claim 1, wherein the plasma generation gas source comprises an alcohol vapor.

7. The method of claim 1, wherein the plasma generation gas source further comprises a halogen gas.

8. The method of claim 1, wherein the plasma generation gas source further comprises diatomic oxygen ($O_2$) and/or ozone ($O_3$).

9. The method of claim 1, wherein the plasma generation gas source further comprises hydrogen peroxide ($H_2O_2$).

10. The method of claim 1, wherein the plasma comprises one or more chemical functional groups selected from the group consisting of: O radicals, OH radicals, CO radicals, Cl radicals, Br radicals, I radicals, and combinations thereof.

11. The method of claim 1, wherein the plasma generation gas source is substantially free of reactive nitrogen.

12. The method of claim 1, wherein the plasma generation gas source further comprises inert gas and/or hydrogen ($H_2$).

13. The method of claim 1, wherein the plasma is generated remotely and delivered to a reaction chamber where the substrate is exposed to the plasma.

14. The method of claim 1, wherein the plasma is generated in-situ in a reaction chamber where the substrate is exposed to the plasma.

15. The method of claim 1, wherein the first material comprises amorphous carbon, spin-on-carbon, spin-on-glass, silicon carbide, or silicon oxycarbide.

16. The method of claim 1, wherein the first material comprises amorphous silicon, silicon oxide, silicon nitride, or silicon oxynitride.

17. The method of claim 1, wherein the bonds between the first material and the chemical functional groups from the plasma promote adhesion between the substrate and the metal-containing photoresist by promoting formation of metal-oxygen bonds on the surface of the substrate while depositing the metal-containing photoresist in (d).

18. The method of claim 1, wherein exposing the substrate to the plasma forms C=O bonds, C—OH bonds, C—Cl bonds, C—Br bonds, C—I bonds, Si—O bonds, Si—OH bonds, Si—Cl bonds, Si—Br bonds, Si—I bonds, or a combination thereof.

19. The method of claim 1, wherein depositing the metal-containing photoresist on the modified surface of the substrate forms C—O-metal bonds and/or Si—O-metal bonds.

20. The method of claim 1, wherein (c) occurs after the first material is deposited on the substrate, in a reaction chamber where the first material is deposited on the substrate.

21. The method of claim 1, wherein (c) and (d) occur in the same reaction chamber.

22. The method of claim 1, further comprising exposing the substrate to a second plasma comprising inert gas prior to (d), wherein exposing the substrate to the second plasma increases a surface area of the substrate.

23. The method of claim 1, wherein the first material is a hardmask material.

24. The method of claim 1, wherein the first material is a porous interface layer.

25. The method of claim 1, wherein the plasma generation gas source comprises carbon dioxide, the method further comprising waiting at least about 3 hours between exposing the substrate to the plasma in (c) and depositing the metal-containing photoresist in (d).

26. The method of claim 1, wherein exposing the substrate to the plasma in (c) only modifies the uppermost 5 Å, or less, of the first material.

27. The method of claim 1, wherein exposing the substrate to the plasma in (c) does not cause an increase in formation of photoresist scum when the metal-containing photoresist is developed.

28. The method of claim 1, wherein the plasma generation gas source comprises carbon dioxide, and wherein the plasma is generated at a pressure between about 5-100 mTorr and an RF power between about 50-1,000 W.

29. The method of claim 1, wherein the plasma generation gas source comprises water, and wherein the plasma is generated at a pressure between about 5-300 mTorr and an RF power between about 100-2,000 W.

30. The method of claim 1, wherein the plasma generation gas source flows at a rate between about 100-5000 sccm during (b) and (c).

31. The method of claim 1, wherein (c) occurs at a temperature between about 20-100° C.

32. The method of claim 1, further comprising applying a bias of up to about 100 V on the substrate while the substrate is exposed to the plasma in (c), or while the substrate is exposed to a second plasma prior to (c), wherein applying the bias on the substrate attracts ions to the surface of the substrate, thereby roughening the surface of the substrate.

33. The method of claim 32, wherein the bias applied to the substrate is between about 0-50 V.

34. A system for promoting adhesion between a substrate and a metal-containing photoresist, the system comprising:

at least one reaction chamber;

at least one plasma generator;

at least one inlet for providing gas and/or plasma to the at least one reaction chamber; and a controller having at least one processor, the at least one processor configured to control the at least one reaction chamber, the at least one plasma generator, and the at least one inlet to cause:

(a) receiving the substrate in the at least one reaction chamber, the substrate having a surface comprising a first material, wherein the first material comprises a silicon-based material and/or a carbon-based material, (b) generating a plasma comprising chemical functional groups from a plasma generation gas source, wherein the plasma generation gas source comprises one or more of alcohol vapor, carbon monoxide, and carbon dioxide, (c) providing the plasma to the at least one reaction chamber, wherein the surface of the substrate is modified by bonds formed between the first material and chemical functional groups from the plasma, and (d) after (c), providing the metal-containing photoresist to the at least one reaction chamber, wherein the metal-containing photoresist deposits on the modified surface of the substrate, and wherein the bonds between the first material and chemical functional groups from the plasma promote adhesion between the substrate and the metal-containing photoresist.

35. The system of claim 34, wherein the at least one processor controls the at least one inlet to provide the plasma and the metal-containing photoresist to one given reaction chamber of the at least one reaction chamber.

36. The system of claim 34, wherein the at least one processor controls the at least one inlet to provide the plasma and the metal-containing photoresist to two different chambers of the at least one reaction chamber.

37. A structure, comprising:

a substrate;

a first material deposited on the substrate, the first material being silicon-based or carbon-based and comprising a modified surface comprising hydroxyl groups; and a metal-containing photoresist deposited on the modified surface of the first material, wherein the metal-containing photoresist and the modified surface form metal-oxygen-silicon bonds and/or metal-oxygen-carbon bonds.

\* \* \* \* \*